(12) United States Patent
Nakamura

(10) Patent No.: US 10,332,758 B2
(45) Date of Patent: Jun. 25, 2019

(54) SUBSTRATE TREATMENT APPARATUS

(71) Applicant: DAINIPPON SCREEN MFG. CO., LTD., Kyoto (JP)

(72) Inventor: Kazuki Nakamura, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 206 days.

(21) Appl. No.: 14/329,414

(22) Filed: Jul. 11, 2014

(65) Prior Publication Data

US 2014/0326281 A1    Nov. 6, 2014

Related U.S. Application Data

(62) Division of application No. 13/228,034, filed on Sep. 8, 2011, now Pat. No. 8,815,111.

(30) Foreign Application Priority Data

Sep. 28, 2010 (JP) ................................ 2010-217217

(51) Int. Cl.
  *B44C 1/22* (2006.01)
  *H01L 21/67* (2006.01)

(52) U.S. Cl.
  CPC .. *H01L 21/67051* (2013.01); *H01L 21/67028* (2013.01)

(58) Field of Classification Search
  USPC .................................................... 156/345.21
  See application file for complete search history.

(56) References Cited

U.S. PATENT DOCUMENTS

| 5,882,433 A | 3/1999 | Ueno ............................... 134/31 |
| 5,968,592 A | 10/1999 | Yoshida et al. ............... 427/240 |
| 6,642,142 B2 * | 11/2003 | Nagai ....................... B08B 3/10 |
| | | 134/31 |

(Continued)

FOREIGN PATENT DOCUMENTS

| CN | 101075553 A | 11/2007 |
| CN | 101175579 A | 5/2008 |

(Continued)

OTHER PUBLICATIONS

Machine Generated English Translation of KR20090131207. Published Dec. 28, 2009.*

(Continued)

*Primary Examiner* — Sylvia MacArthur
(74) *Attorney, Agent, or Firm* — Ostrolenk Faber LLP

(57) ABSTRACT

A substrate treatment apparatus for treating a substrate with a chemical liquid in a treatment chamber. The apparatus includes a higher temperature chemical liquid supplying unit, and a rinse liquid supplying unit for rinsing away the higher temperature chemical liquid. A control unit controls a rotation unit for rotating the substrate, as well as the chemical liquid supplying unit and the rinse liquid supplying unit. The higher temperature chemical liquid is supplied while rotating the substrate at a first speed; the rinse liquid is supplied to a center portion of the substrate while rotating the substrate at a lower speed, so that the rinse liquid remains in said center portion; and then the substrate is rotated at a higher speed to spread the rinse liquid over the entire substrate while supplying the rinse liquid onto said center portion.

5 Claims, 13 Drawing Sheets

(56) References Cited

U.S. PATENT DOCUMENTS

| | | | |
|---|---|---|---|
| 6,805,769 B2* | 10/2004 | Okuda | B08B 3/024 134/113 |
| 6,949,883 B2 | 9/2005 | Matsueda | 315/169.3 |
| 8,815,111 B2* | 8/2014 | Nakamura | H01L 21/67051 134/32 |
| 2004/0187896 A1 | 9/2004 | Konishi et al. | 134/33 |
| 2005/0000940 A1 | 1/2005 | Iwamoto et al. | 216/83 |
| 2006/0048792 A1 | 3/2006 | Nakamura et al. | 134/2 |
| 2006/0244078 A1 | 11/2006 | Iwamoto et al. | 257/397 |
| 2007/0062560 A1 | 3/2007 | Imatani et al. | 134/2 |
| 2007/0183775 A1 | 8/2007 | Mitsuhashi et al. | 396/611 |
| 2007/0231483 A1 | 10/2007 | Nanba et al. | 427/240 |
| 2007/0267047 A1 | 11/2007 | Hori et al. | 134/33 |
| 2008/0052947 A1* | 3/2008 | Miya | H01L 21/67028 34/317 |
| 2008/0078426 A1* | 4/2008 | Miya | H01L 21/67028 134/30 |
| 2008/0142054 A1* | 6/2008 | Eitoku | H01L 21/6708 134/30 |
| 2008/0190455 A1 | 8/2008 | Kinoshita et al. | 134/21 |
| 2009/0229641 A1 | 9/2009 | Yoshida | 134/107 |
| 2009/0250079 A1* | 10/2009 | Yoshihara | B08B 3/024 134/4 |
| 2009/0272407 A1 | 11/2009 | Nakamura et al. | 134/18 |
| 2009/0317981 A1 | 12/2009 | Lee et al. | 438/748 |
| 2010/0247761 A1* | 9/2010 | Hashimoto | H01L 21/67051 427/240 |
| 2011/0277793 A1* | 11/2011 | Inada | H01L 21/67051 134/18 |
| 2012/0067847 A1* | 3/2012 | Sakurai | H01L 21/31111 216/83 |
| 2012/0234362 A1 | 9/2012 | Yoshihara et al. | 134/33 |
| 2014/0231013 A1* | 8/2014 | Hinode | C09K 13/04 156/345.23 |
| 2014/0326281 A1* | 11/2014 | Nakamura | H01L 21/67028 134/95.1 |

FOREIGN PATENT DOCUMENTS

| | | | |
|---|---|---|---|
| CN | 101551602 A | | 10/2009 |
| CN | 101615568 A | | 12/2009 |
| JP | 3-22428 | | 1/1991 |
| JP | 9-38595 | | 2/1997 |
| JP | 09152272 A | * | 6/1997 |
| JP | 10-92734 A | | 4/1998 |
| JP | 2001-271188 | | 10/2001 |
| JP | 2004-111668 | | 4/2004 |
| JP | 2004-335923 | | 11/2004 |
| JP | 2005-191163 A | | 7/2005 |
| JP | 2005-286211 | | 10/2005 |
| JP | 2006-344907 | | 12/2006 |
| JP | 2007-81291 A | | 3/2007 |
| JP | 2007-88381 | | 4/2007 |
| JP | 2007088381 A | * | 4/2007 |
| JP | 2007-266302 | | 10/2007 |
| JP | 2008-109058 | | 5/2008 |
| JP | 2009-021444 A | | 1/2009 |
| JP | 2009-218405 | | 9/2009 |
| JP | 2009-231619 | | 10/2009 |
| JP | 2009-233493 | | 10/2009 |
| JP | 2009-239026 | | 10/2009 |
| JP | 2009-295910 A | | 12/2009 |
| JP | 2010-10679 | | 1/2010 |
| KR | 10-0550028 | | 2/2006 |
| KR | 20090131207 A | * | 12/2009 |
| TW | 200802562 A | | 1/2008 |

OTHER PUBLICATIONS

Machine Generated English Translation of JP2007-088381. Published Apr. 5, 2007.*

Machine Generated English Translation of JP09-152272A. Published Jun. 10, 1997.*

* cited by examiner

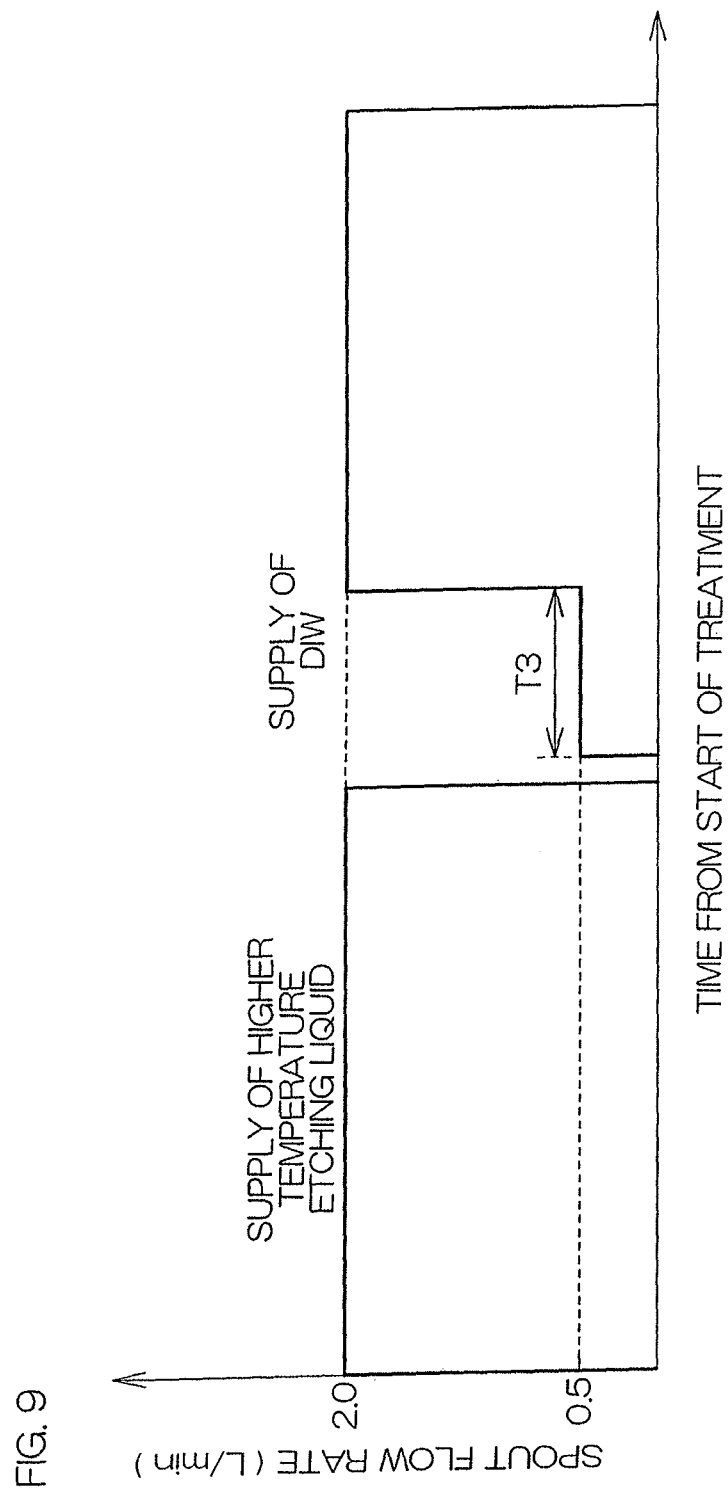

SUBSTRATE TREATMENT APPARATUS

CROSS-REFERENCE TO RELATED APPLICATIONS

This application is a divisional of U.S. patent application Ser. No. 13/228,034, filed Sep. 8, 2011, incorporated herein by reference, which claims the benefit of Japanese Patent Application No. 2010-217217, filed Sep. 28, 2010, incorporated herein by reference.

BACKGROUND OF THE INVENTION

1. Field of the Invention

The present invention relates to a substrate treatment method and a substrate treatment apparatus for treating a substrate with a treatment liquid. Examples of the substrate to be treated include semiconductor wafers, glass substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates, and substrates for solar cells.

2. Description of Related Art

In production processes for semiconductor devices and liquid crystal display devices, substrate treatment apparatuses of a single substrate treatment type are often used, which are adapted to perform a treatment on a single substrate (e.g., a semiconductor wafer or a liquid crystal display glass substrate) at a time for treating a front surface of the substrate with a chemical liquid.

The substrate treatment apparatus of the single substrate treatment type includes a spin chuck which horizontally holds and rotates the substrate, a chemical liquid nozzle which supplies the chemical liquid to the front surface of the substrate rotated by the spin chuck, and a deionized water nozzle which supplies deionized water to a center portion of the front surface of the substrate rotated by the spin chuck.

In the substrate treatment apparatus of the single substrate treatment type, the chemical liquid is supplied from the chemical liquid nozzle onto the front surface of the rotated substrate. Thus, the front surface of the substrate is treated with the chemical liquid (chemical liquid treatment step). After the supply of the chemical liquid is stopped, the deionized water is supplied from the deionized water nozzle onto the center portion of the front surface of the substrate. The deionized water supplied onto the front surface of the substrate receives a centrifugal force generated by the rotation of the substrate to flow toward a peripheral edge of the substrate over the front surface of the substrate. Thus, the chemical liquid is rinsed away from the substrate with the deionized water (rinsing step). In the rinsing step, the substrate is rotated at the same rotation speed as in the chemical liquid treatment step. The flow rate of the deionized water supplied from the deionized water nozzle is constant, and generally equals to a chemical liquid supply flow rate. After the supply of the deionized water is stopped, the rotation of the substrate is accelerated, and the deionized water is spun away from the substrate. Thus, the substrate is dried, and a series of treatment steps are completed.

Two exemplary methods for supplying the chemical liquid to the substrate include a center spouting method, and a scanning method. In the center spouting method, the chemical liquid is spouted toward the rotation center of the front surface of the substrate rotated by the spin chuck (see JP-A-2005-286551). In the scanning method, the chemical liquid nozzle is moved above the substrate (see JP-A-2007-88381). More specifically, the chemical liquid is supplied from the chemical liquid nozzle onto the front surface of the substrate rotated by the spin shuck, while the chemical liquid nozzle is moved over the substrate.

In the substrate treatment apparatus of the single substrate treatment type, a chemical liquid heated up to a higher temperature may be used to increase the treatment speed. The chemical liquid supplied from the chemical liquid nozzle has a higher temperature immediately after being supplied onto the front surface of the substrate, but is deprived of heat by the substrate and the ambient environment when flowing over the front surface of the substrate. Thus, the temperature of the chemical liquid is reduced. Therefore, the higher temperature chemical liquid supplied onto the front surface of the substrate from the chemical liquid nozzle has the highest treatment ability at a chemical liquid supply position.

During the supply of the chemical liquid by the center spouting method, the chemical liquid supplied onto the center portion of the front surface of the substrate receives a centrifugal force generated by the rotation of the substrate to flow toward the peripheral edge on the front surface of the substrate to spread over the entire front surface of the substrate. Where the chemical liquid heated up to a higher temperature is used, the chemical liquid has a relatively high temperature on the center portion of the substrate, and has a relatively low temperature on the other portion of the substrate. This results in variations in treatment efficiency within the front surface of the substrate. That is, the chemical liquid treatment proceeds at a higher treatment rate on the center portion of the front surface of the substrate, and proceeds at a lower treatment rate on the other portion of the front surface of the substrate. As a result, the front surface of the substrate is unevenly treated.

During the supply of the chemical liquid by the scanning method, on the other hand, the chemical liquid supply position is moved over the front surface of the substrate by the movement of the nozzle. That is, the chemical liquid supply position is moved (scanned) between the rotation center and the peripheral edge of the front surface of the substrate.

However, the scanning method also fails to evenly perform the chemical liquid treatment on the front surface of the substrate by supplying the chemical liquid heated up to a higher temperature onto the substrate. That is, a movement speed at a point on the front surface of the substrate is increased, as a distance between the point and the rotation center of the substrate increases. Therefore, if the chemical liquid supply rate is constant, the amount of the chemical liquid supplied to a unit area of the front surface of the substrate is reduced as a distance between the chemical liquid supply position and the rotation center increases. This results in variations in treatment efficiency within the front surface of the substrate. More specifically, the chemical liquid treatment proceeds at a relatively high rate on the center portion of the front surface of the substrate, and proceeds at a relatively low rate on the other portion of the front surface of the substrate. Even if the higher temperature chemical liquid is supplied onto the substrate by the scanning method, it is impossible to evenly perform the chemical liquid treatment on the front surface of the substrate.

SUMMARY OF THE INVENTION

It is an object of the present invention to provide a substrate treatment method and a substrate treatment apparatus which ensure that the chemical liquid treatment can be evenly performed on the entire front surface of the substrate.

A substrate treatment method according to the present invention includes: a higher temperature chemical liquid supplying step of supplying a higher temperature chemical liquid onto a front surface of a substrate in a treatment chamber, the higher temperature chemical liquid having a higher temperature than the treatment chamber; and a rinse liquid supplying step of supplying a rinse liquid onto the front surface of the substrate to rinse away the chemical liquid after the higher temperature chemical liquid supplying step. The rinse liquid supplying step includes a peripheral edge portion treating step of supplying the rinse liquid selectively onto a center portion of the front surface of the substrate so that a chemical liquid treatment is inhibited on the center portion while being allowed to proceed on a peripheral edge portion of the front surface of the substrate; and an entire surface rinsing step of spreading the rinse liquid over the entire front surface of the substrate to replace the chemical liquid with the rinse liquid on the entire front surface of the substrate after the peripheral edge portion treating step. The peripheral edge portion treating step is preferably performed at an initial stage of the rinse liquid supplying step. In the peripheral edge portion treating step, the peripheral edge portion is selectively treated with a part of the chemical liquid remaining on the peripheral edge portion of the front surface of the substrate.

In the higher temperature chemical liquid supplying step of supplying the higher temperature chemical liquid onto the front surface of the substrate, the chemical liquid treatment proceeds at a relatively high rate on the center portion of the front surface of the substrate, and proceeds at a relatively low rate on the other portion of the front surface of the substrate. Therefore, the chemical liquid treatment is liable to unevenly proceed within the front surface of the substrate.

According to the inventive method, the peripheral edge portion treating step is performed, for example, at an initial stage of the rinse liquid supplying step performed subsequently to the higher temperature chemical liquid supplying step. In the peripheral edge portion treating step, the rinse liquid is supplied selectively onto the center portion of the front surface of the substrate. By the selective supply of the rinse liquid, the chemical liquid is replaced with the rinse liquid rapidly on the center portion of the front surface of the substrate, but replaced with the rinse liquid at a lower replacement efficiency on the peripheral edge portion of the front surface of the substrate. Therefore, the chemical liquid remains on the peripheral edge portion of the front surface of the substrate. Thus, the chemical liquid treatment is stopped on the center portion of the front surface of the substrate, while the peripheral edge portion of the front surface of the substrate is selectively treated with the remaining chemical liquid. The treatment with the remaining chemical liquid makes up for a delay in the treatment on the peripheral edge portion of the front surface of the substrate. Thus, the chemical liquid treatment can be evenly performed on the entire front surface of the substrate.

Since the peripheral edge portion treating step is performed during the rinse liquid supplying step, there is no need to additionally perform the step of selectively treating the peripheral edge portion of the front surface of the substrate with the chemical liquid. That is, the chemical liquid treatment can be evenly performed on the front surface of the substrate without prolonging the overall treatment period.

According to one embodiment of the present invention, the substrate treatment method further includes a chemical liquid treating/rotating step of rotating the substrate at a predetermined first rotation speed, the chemical liquid treating/rotating step being performed in parallel to the higher temperature chemical liquid supplying step. Further, the peripheral edge portion treating step includes a lower speed rotating step of rotating the substrate at a second rotation speed lower than the first rotation speed while supplying the rinse liquid onto the center portion of the front surface of the substrate.

According to this method, the peripheral edge portion treating step includes the lower speed rotating step, in which the substrate is rotated at a lower rotation speed than in the higher temperature chemical liquid supplying step. In the lower speed rotating step, a very small centrifugal force or virtually no centrifugal force acts on the rinse liquid supplied onto the front surface of the substrate. Therefore, the rinse liquid supplied onto the center portion of the front surface of the substrate remains on the center portion. This makes it possible to supply the rinse liquid selectively onto the center portion of the front surface of the substrate at the initial stage of the rinse liquid supplying step.

The peripheral edge portion treating step may further include a higher speed rotating step of rotating the substrate at a speed that is generally equal to the first rotation speed, while supplying the rinse liquid onto the center portion of the front surface of the substrate, the higher speed rotating step being performed before the lower speed rotating step.

According to this method, the higher speed rotating step is performed at the beginning of the rinse liquid supplying step, and the lower speed rotating step is performed after the higher speed rotating step. In the higher speed rotating step, the rinse liquid supplied onto the front surface of the substrate receives a centrifugal force generated by the rotation of the substrate to spread over the front surface of the substrate. In the lower speed rotating step performed after the higher speed rotating step, the rotation speed of the substrate is reduced, so that a very small centrifugal force or virtually no centrifugal force acts on the rinse liquid flowing over the front surface of the substrate. Therefore, the lower speed rotating step is performed when the center portion of the front surface of the substrate is entirely covered with the rinse liquid. Thus, the chemical liquid can remain only on the peripheral edge portion of the front surface of the substrate. This makes it possible to selectively treat only the peripheral edge portion of the front surface of the substrate with the chemical liquid.

According to another embodiment of the present invention, a rinse liquid supply flow rate at which the rinse liquid is supplied in the peripheral edge portion treating step is lower than a chemical liquid supply flow rate at which the chemical liquid is supplied in the higher temperature chemical liquid supplying step in the substrate treatment method. In this method, the rinse liquid supplied onto the front surface of the substrate at the lower flow rate hardly spreads over the front surface of the substrate, but remains on the center portion of the front surface of the substrate. Thus, the rinse liquid can be supplied selectively onto the center portion of the front surface of the substrate at the initial stage of the rinse liquid supplying step.

The rinse liquid supplied onto the front surface of the substrate in the rinse liquid supplying step preferably has a higher temperature than the treatment chamber. If an ordinary temperature rinse liquid (e.g., having a temperature substantially equal to the internal ambient temperature of the treatment chamber) is supplied onto the front surface of the substrate in the rinse liquid supplying step, the chemical liquid on the front surface of the substrate is deprived of heat by the rinse liquid at the beginning of the rinse liquid supplying step, resulting in sudden temperature reduction. This reduces the temperature of the chemical liquid remaining on the peripheral edge portion of the front surface of the substrate, thereby reducing the treatment ability of the remaining chemical liquid. Therefore, the higher temperature rinse liquid is supplied onto the front surface of the substrate to suppress the temperature reduction of the chemical liquid remaining on the peripheral edge portion of the front surface of the substrate. Thus, the chemical liquid remaining on the peripheral edge portion of the front surface of the substrate can exhibit a higher treatment ability.

A substrate treatment apparatus according to the present invention includes: a treatment chamber; a rotation unit which rotates a substrate in the treatment chamber; a higher temperature chemical liquid supplying unit which supplies a higher temperature chemical liquid onto a front surface of the substrate, the higher temperature chemical liquid having a higher temperature than the treatment chamber; a rinse liquid supplying unit which supplies a rinse liquid onto the front surface of the substrate to rinse away the chemical liquid; and a control unit which controls a rotating operation of the rotation unit, a chemical liquid supplying operation of the higher temperature chemical liquid supplying unit and a rinse liquid supplying operation of the rinse liquid supplying unit. The control unit includes: a peripheral edge portion treatment control unit which controls the rotation unit and the rinse liquid supplying unit to selectively supply the rinse liquid onto a center portion of the front surface of the substrate so that a chemical liquid treatment is inhibited on the center portion while being allowed to proceed on a peripheral edge portion of the front surface of the substrate; and an entire surface rinsing control unit which controls the rotation unit and the rinse liquid supplying unit so as to spread the rinse liquid over the entire front surface of the substrate to replace the chemical liquid with the rinse liquid on the entire front surface of the substrate. The control unit supplies the rinse liquid selectively onto the center portion of the front surface of the substrate, for example, at an initial stage of a rinse liquid supplying step of supplying the rinse liquid onto the front surface of the substrate. At this time, the peripheral edge portion of the front surface of the substrate is selectively treated with a part of the chemical liquid remaining on the peripheral edge portion.

This arrangement provides the same effects as the inventive substrate treatment method described above.

The foregoing and other objects, features and effects of the present invention will become more apparent from the following detailed description of the preferred embodiments with reference to the attached drawings.

BRIEF DESCRIPTION OF THE DRAWINGS

FIG. 9 is a diagram showing changes in the supply flow rates of treatment liquids in Exemplary Process 3.

DETAILED DESCRIPTION OF THE PREFERRED EMBODIMENTS

Figure 1:
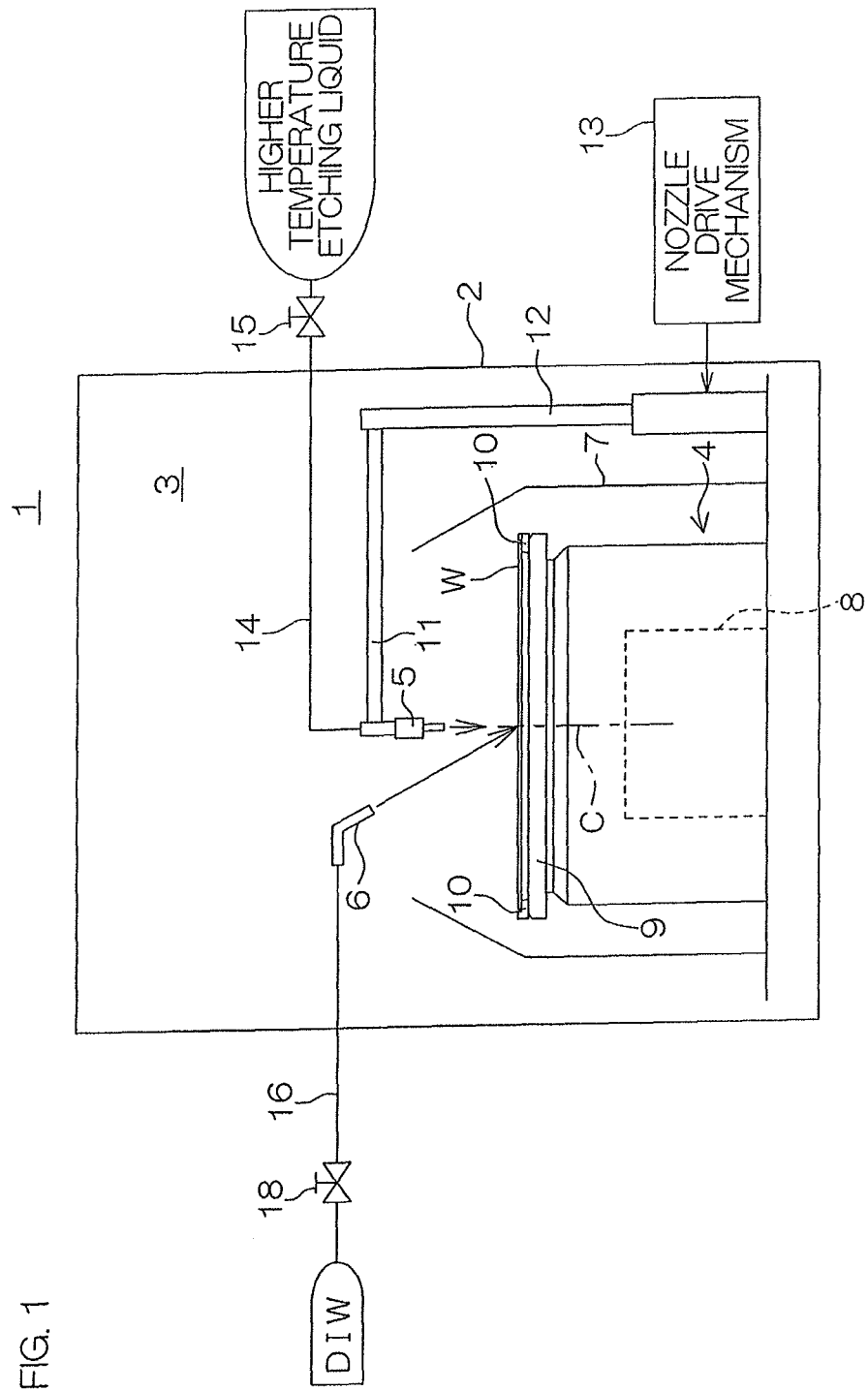
FIG. 1 is a schematic sectional view showing the construction of a substrate treatment apparatus according to a first embodiment of the present invention.

FIG. 1 is a schematic sectional view showing the construction of a substrate treatment apparatus 1 according to one embodiment (first embodiment) of the present invention. The substrate treatment apparatus 1 is of a single substrate treatment type, which is adapted to treat a round semiconductor wafer W (hereinafter referred to simply as "wafer W") as an exemplary substrate. In this embodiment, an etching treatment (e.g., an oxide film etching treatment) is performed as an exemplary cleaning process on a front surface of the wafer W having a device formation region. An etching liquid is used as a chemical liquid for the etching treatment. An example of the etching liquid is a diluted hydrofluoric acid solution.

The substrate treatment apparatus 1 has a treatment chamber 3 defined by a partition wall 2. A spin chuck 4, a chemical liquid nozzle 5, a DIW nozzle 6 and a cup 7 are provided in the treatment chamber 3. The spin chuck 4 is configured to generally horizontally hold the wafer W and rotate the wafer W about a rotation axis C extending vertically through the center of the wafer W. The chemical liquid nozzle 5 is configured to supply a higher temperature etching liquid toward the front surface (upper surface) of the wafer W held by the spin chuck 4. The DIW nozzle 6 is configured to supply an ordinary temperature DIW (deionized water) (e.g., at 25° C.) as a rinse liquid onto a center portion of the front surface of the wafer W held by the spin chuck 4. The cup 7 contains the spin chuck 4.

The spin chuck 4 includes a spin motor (rotation unit) 8, a spin base 9 and holder members 10. The spin base 9 is a disk-shaped member which is rotated about the rotation axis C by a rotative drive force of the spin motor 8. The holder members 10 are generally equidistantly arranged along a peripheral edge of the spin base 9, and configured to hold the wafer W generally horizontally. With this arrangement, the spin chuck 4 rotates the spin base 9 by the rotative drive force of the spin motor 8 with the wafer W held by the holder members 10. Thus, the spin chuck 4 can rotate the wafer W together with the spin base 9 about the rotation axis C while generally horizontally holding the wafer W.

The spin chuck 4 is not limited to the spin chuck of the holder type, but a chuck of a vacuum suction type (vacuum chuck) or other type may be employed as the spin chuck 4. The chuck of the vacuum suction type is configured to suck a back surface of the wafer W by vacuum suction to horizontally hold the wafer W and, in this state, rotate the wafer W about the vertical rotation axis. Thus, the chuck of the vacuum suction type can rotate the wafer W held thereby.

The chemical liquid nozzle 5 is, for example, a straight nozzle which spouts the etching liquid heated up to a higher temperature (e.g., 60° C.) in a continuous flow state. The chemical liquid nozzle 5 is attached to a distal end of an arm 11 with its spout directed downward. The arm 11 extends generally horizontally, and its proximal end is supported by an upper end of a support shaft 12 extending generally vertically on a lateral side of the cup 7. The support shaft 12 is connected to a nozzle drive mechanism 13 including a motor. A rotative force is inputted to the support shaft 12 from the nozzle drive mechanism 13 to rotate the support shaft 12, whereby the arm 11 is pivoted above the spin chuck 4 to horizontally move the chemical liquid nozzle 5 over the front surface of the wafer W.

The chemical liquid nozzle 5 is connected to an etching liquid supply pipe 14 to which the higher temperature etching liquid is supplied from a higher temperature etching liquid supply source. An etching liquid valve 15 for switching on and off the supply of the etching liquid from the chemical liquid nozzle 5 is provided in the etching liquid supply pipe 14.

The wafer W is held by the spin chuck 4, and the chemical liquid nozzle 5 is located above the wafer W. In this state, the etching liquid is spouted from the chemical liquid nozzle 5, whereby the etching liquid is supplied onto the front surface of the wafer W. When the etching liquid is supplied from the chemical liquid nozzle 5 onto the front surface of the wafer W, the arm 11 is pivoted within a predetermined angular range. Thus, an etching liquid supply position on the front surface of the wafer W is moved along an arc within a range from the rotation center of the wafer W (a point on the rotation axis C of the wafer W) to the peripheral edge portion of the wafer W.

The DIW nozzle 6 is, for example, a straight nozzle which supplies DIW in a continuous flow state. The DIW nozzle 6 is fixedly disposed above the spin chuck 4 with its supply port directed toward the rotation center of the wafer W. The DIW nozzle 6 is connected to a DIW supply pipe 16 to which ordinary temperature DIW (e.g., at 25° C.) is supplied from a DIW supply source. A DIW valve 18 for switching on and off the supply of the DIW from the DIW nozzle 6 is provided in the DIW supply pipe 16.

The cup 7 is a bottomed hollow cylindrical container which collects the etching liquid and the DIW used for the treatment of the wafer W.

Figure 2:
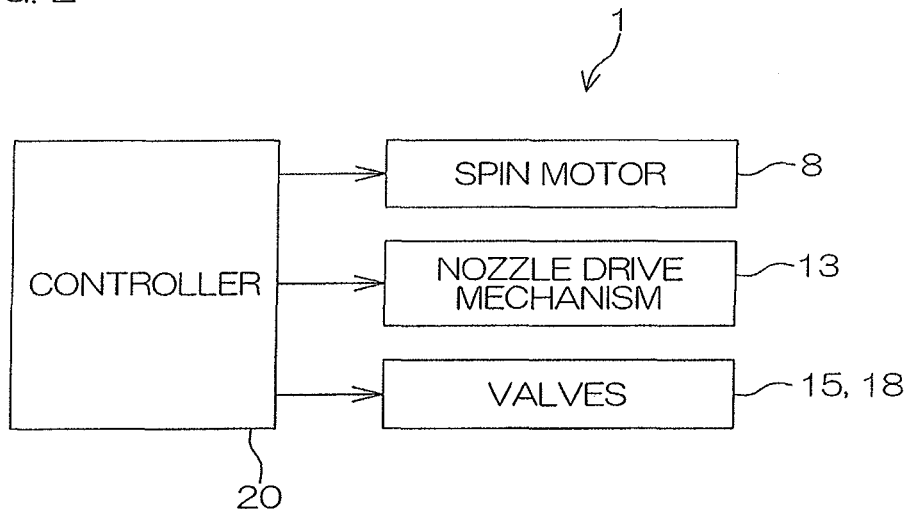
FIG. 2 is a block diagram showing the electrical construction of the substrate treatment apparatus shown in FIG. 1.

FIG. 2 is a block diagram showing the electrical construction of the substrate treatment apparatus 1.

The substrate treatment apparatus 1 includes a controller 20 including a microcomputer. The spin motor 8, the nozzle drive mechanism 13, the etching liquid valve 15, the DIW valve 18 and the like are connected as controllable components to the controller 20, and the controller 20 is programmed so as to control these controllable components.

Figure 3:
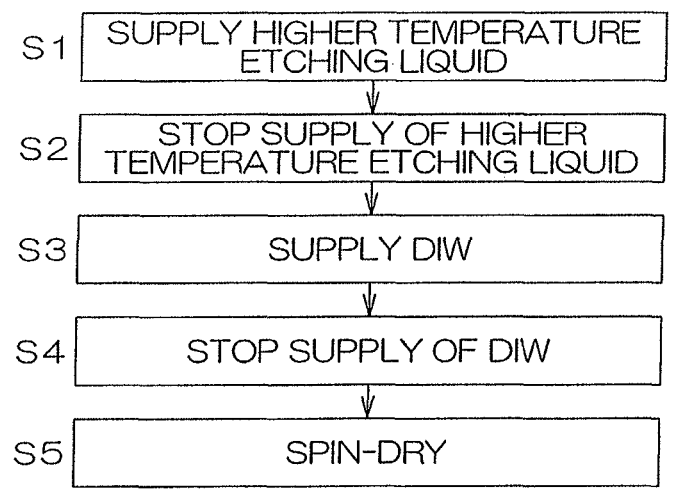
FIG. 3 is an overall process diagram for Exemplary Processes 1, 2 and 3.
Figure 3A:
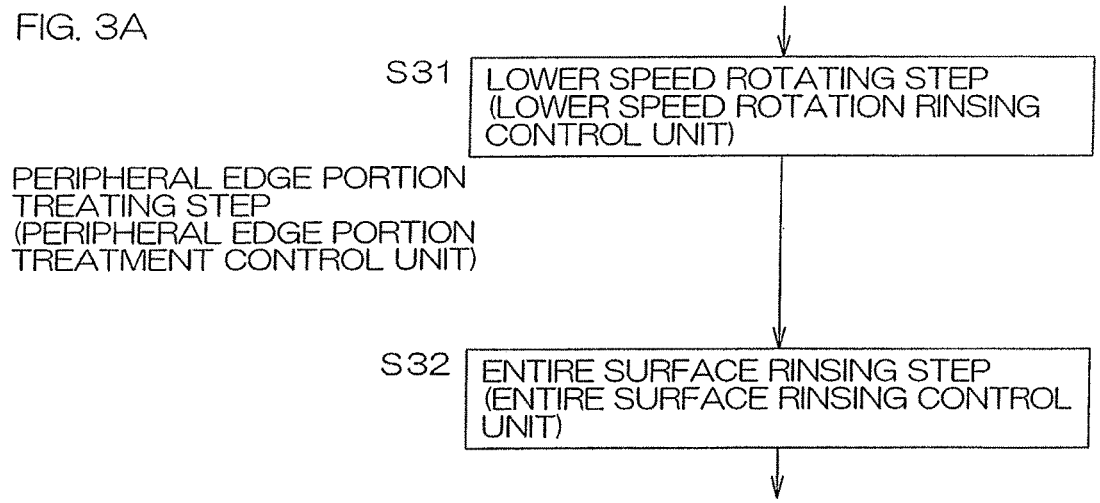
FIGS. 3A, 3B and 3C are flow charts for explaining variations of a DIW supplying step (Step S3 in FIG. 3) in Exemplary Processes 1, 2 and 3, respectively, in detail.
Figure 4:
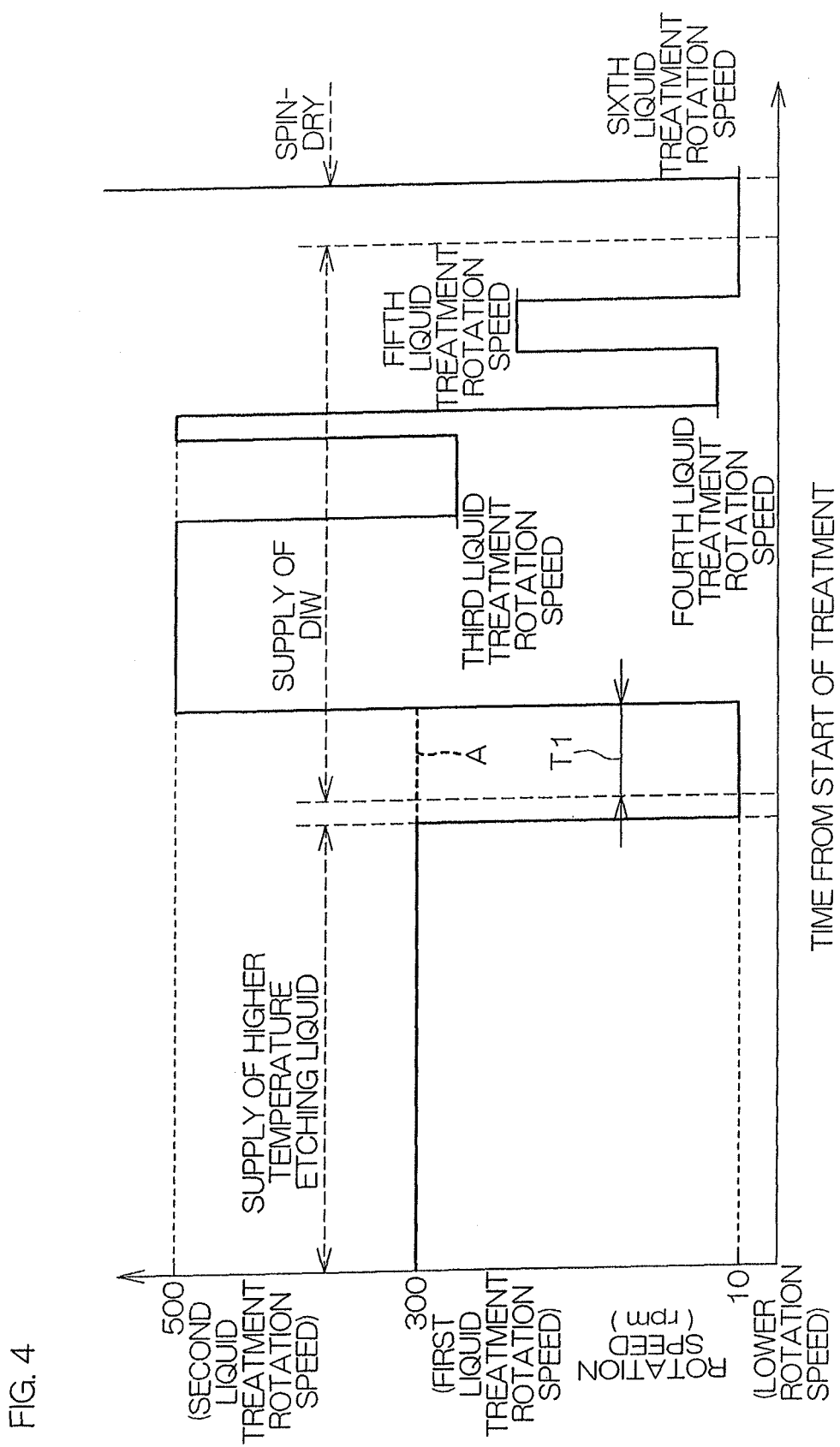
FIG. 4 is a diagram showing changes in wafer rotation speed in Exemplary Process 1.
Figure 5A:
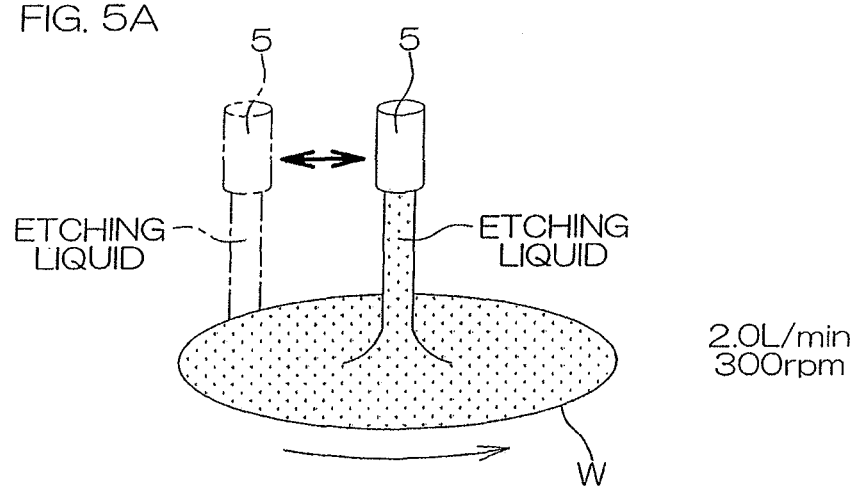
FIGS. 5A, 5B and 5C are diagrams for explaining wafer treatment states in various steps of Exemplary Process 1.
Figure 5B:
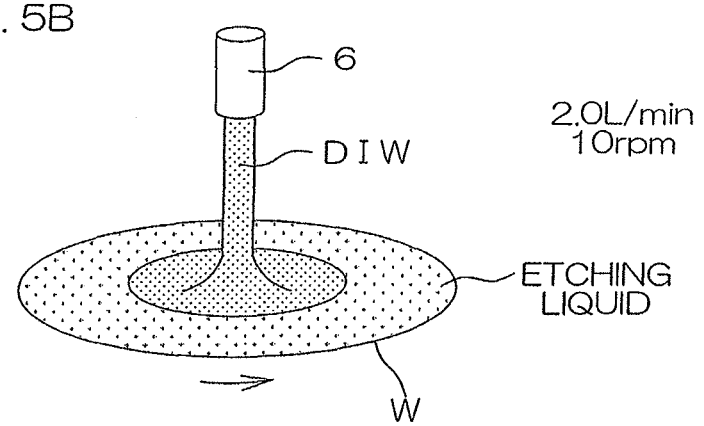
Figure 5C:
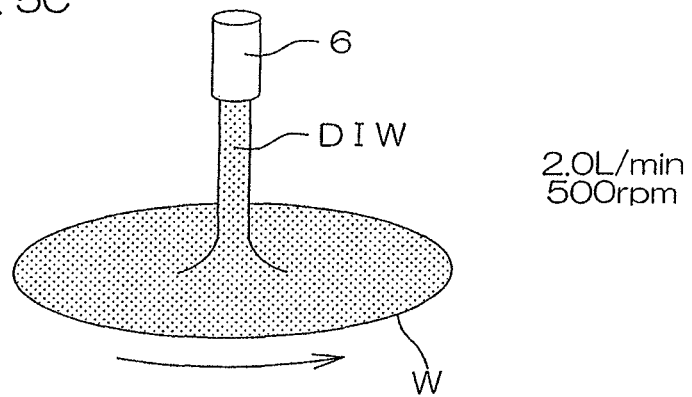

FIG. 3 is a process diagram showing an exemplary etching treatment to be performed by the substrate treatment apparatus 1. FIG. 3A is a flow chart showing a DIW supplying step (Step S3 in FIG. 3) of Exemplary Process 1 in detail. FIG. 4 is a diagram showing changes in the rotation speed of the wafer W in Exemplary Process 1. FIGS. 5A, 5B and 5C are diagrams for explaining wafer treatment states in various steps of Exemplary Process 1.

A wafer W to be treated is loaded into the treatment chamber 3 by a transport robot (not shown), and transferred to the spin chuck 4 with its front surface up. At this time, the chemical liquid nozzle 5 is located at a home position on a lateral side of the cup 7 so as not to hinder the loading of the wafer W.

After the wafer W is held by the spin chuck 4, the controller 20 controls the spin motor 8 to rotate the wafer W at a first liquid treatment rotation speed (first rotation seed, e.g., 300 rpm). Further, the arm 11 is swiveled to move the chemical liquid nozzle 5 from the home position to a position on the rotation axis C of the wafer W.

Upon completion of the movement of the chemical liquid nozzle 5, the controller 20 opens the etching liquid valve 15 to supply the higher temperature etching liquid (e.g., at 60° C.) from the chemical liquid nozzle 5 (Step S1 in FIG. 3: higher temperature etching liquid supplying step for which the controller 20 functions as a higher temperature chemical liquid supply control unit). In the higher temperature etching liquid supplying step, the flow rate of the etching liquid supplied from the chemical liquid nozzle 5 is, for example, 2.0 L/min (see FIG. 5A). In the higher temperature etching liquid supplying step, the controller 20 controls the nozzle drive mechanism 13 to pivot the arm 11 within the predetermined angular range. The arm 11 is pivoted at a constant speed. By the pivoting of the arm 11, the chemical liquid nozzle 5 is reciprocally moved between the position on the rotation axis C of the wafer W and a position above the peripheral edge portion of the wafer W. Thus, the etching liquid supply position on the front surface of the wafer W is reciprocally moved along an arc crossing the direction of the rotation of the wafer W within the range from the rotation center of the wafer W to the peripheral edge portion of the wafer W (see FIG. 5A). In the higher temperature etching liquid supplying step, the wafer W is rotated at a constant rotation speed of, for example, 300 rpm (see FIG. 4).

The peripheral edge portion of the wafer W is, for example, an annular region of the wafer W present outside a circle that is concentric with the wafer W and has a radius about two thirds the radius of the wafer W. More specifically, where the wafer W has an outer diameter of 200 mm, the peripheral edge portion of the wafer W is an annular region present outside a circle concentric with the wafer W and having a radius of about 70 mm. Similarly, where the wafer W has an outer diameter of 300 mm, the peripheral edge portion of the wafer W is an annular region present outside a circle concentric with the wafer W and having a radius of about 100 mm.

The etching liquid supplied from the chemical liquid nozzle 5 onto the front surface of the wafer W spreads over the entire front surface of the wafer W. Thus, the etching liquid is evenly and rapidly supplied over the entire front surface of the wafer W. With the etching liquid thus supplied from the chemical liquid nozzle 5 over the front surface of the wafer W, an oxide film can be removed from the front surface of the wafer W by the chemical ability of the etching liquid.

After a lapse of a predetermined period (e.g., 35 seconds) from the start of the supply of the etching liquid from the chemical liquid nozzle 5, the controller 20 closes the etching liquid valve 15 to stop the supply of the etching liquid to the wafer W (Step S2 in FIG. 3: higher temperature etching liquid supply stopping step). The controller 20 controls the spin motor 8 to reduce the rotation speed of the wafer W to a predetermined lower rotation speed (second rotation speed, e.g., 10 rpm) (see FIG. 4). Then, the controller 20 swivels the arm 11 to return the chemical liquid nozzle 5 to the home position.

The higher temperature etching liquid supplied from the chemical liquid nozzle 5 onto the front surface of the wafer W has a higher temperature immediately after reaching the front surface of the wafer W, but is deprived of heat by the wafer W and the ambient environment when flowing over the wafer W. Thus, the temperature of the etching liquid is reduced. That is, the higher temperature etching liquid supplied from the chemical liquid nozzle 5 has the highest etching ability at an etching liquid supply position (liquid application position). On the other hand, a movement speed at a point on the front surface of the wafer W is increased as a distance between the point and the rotation axis C increases. Therefore, if the etching liquid supply rate is constant in the higher temperature etching liquid supplying step as in Exemplary Process 1, the amount of the etching liquid supplied onto a unit area of the front surface of the wafer W is reduced as a distance between the etching liquid supply position and the rotation axis C increases. Therefore, the etching efficiency is higher on the center portion of the wafer W than on the peripheral edge portion of the waver W. That is, the etching treatment proceeds at a relatively high rate on the center portion of the front surface of the wafer W, and proceeds at a relatively low rate on the other portion of the front surface of the wafer W. Thus, the etching treatment unevenly proceeds on the front surface of the wafer W.

After the supply of the etching liquid is stopped (Step S2 in FIG. 3) and the wafer W is decelerated (see FIG. 4), the controller 20 opens the DIW valve 18 to supply ordinary temperature DIW (e.g., at 25° C.) from the DIW nozzle 6 (Step S3 in FIG. 3: DIW supplying step). The DIW spouted from the DIW nozzle 6 is supplied around the rotation center of the front surface of the wafer W (see FIG. 5B). The DIW is supplied from the DIW nozzle 6 at a constant supply flow rate of, for example, 2.0 L/min.

At this time, as shown in FIG. 4, the wafer W is rotated at a lower rotation speed (e.g., 10 rpm), so that virtually no centrifugal force is generated by the rotation of the wafer W to act on the DIW supplied onto the front surface of the wafer W. Therefore, the DIW supplied onto the front surface of the wafer W remains on the center portion of the front surface of the wafer W to hardly reach the peripheral edge portion of the wafer W. Thus, the etching liquid is replaced with the DIW rapidly on the center portion of the front surface of the wafer W, but replaced with the DIW at a lower replacement efficiency on the peripheral edge portion of the front surface of the wafer W. Therefore, the etching liquid remains on the peripheral edge portion of the front surface of the wafer W (see FIG. 5B). In Exemplary Process 1, the DIW reaches neither the peripheral edge portion of the front surface of the wafer W nor an outer periphery of the center portion of the wafer W in the state shown in FIG. 5B, so that the etching liquid remains on the outer periphery of the center portion of the wafer W. The peripheral edge portion of the front surface of the wafer W and the outer periphery of the center portion of the wafer W are selectively etched with the remaining etching liquid. That is, the controller 20 performs a peripheral edge portion treating step (Step S31 in FIG. 3A: lower speed rotating step) to selectively treat the peripheral edge portion of the wafer W with the remaining etching liquid during a predetermined lower speed rotation period T1 (e.g., 1 to 10 seconds) from the start of the supply of the DIW from the DIW nozzle 6. For this function, the controller 20 serves as a peripheral edge portion treatment control unit or a lower speed rotation rinsing control unit.

After a lapse of the predetermined lower speed rotation period T1 from the start of the supply of the DIW from the DIW nozzle 6, the controller 20 controls the spin motor 8 to increase the rotation speed of the wafer W to a second liquid treatment rotation speed (e.g., 500 rpm), and performs an entire surface rinsing step (see Step S32 in FIG. 3A and FIG. 4). Therefore, the DIW supplied onto the front surface of the wafer W receives a centrifugal force generated by the rotation of the wafer W to flow toward the peripheral edge of the wafer W on the front surface of the wafer W and spread over the entire front surface of the wafer W (see FIG. 5C). Thus, the DIW rinses away the etching liquid from the front surface of the wafer W. For the entire surface rinsing step, the controller 20 functions as an entire surface rinsing control unit.

In Exemplary Process 1, as shown in FIG. 4, the rotation speed of the wafer W is increased to the second liquid treatment rotation speed (e.g., 500 rpm) and then maintained at the second liquid treatment rotation speed. After a predetermined timing (e.g., after a lapse of 25 seconds from the start of the supply of the DIW), however, the rotation speed of the wafer W is changed to a plurality of rotation speed levels.

After the predetermined timing, more specifically, the controller 20 controls the spin motor 8 to change the rotation speed of the wafer W to a third liquid treatment rotation speed (e.g., 280 rpm for 5 seconds), to the second liquid treatment rotation speed (e.g., for 1 second), to a fourth liquid treatment rotation speed (e.g., 30 rpm for 5 seconds), to a fifth liquid treatment rotation speed (e.g., 15 rpm for 3 seconds), and to a sixth liquid treatment rotation speed (e.g., 10 rpm for 5 seconds). A DIW scattering direction in which the DIW is scattered from the peripheral edge of the wafer W is changed by changing the rotation speed of the wafer W to rinse away the etching liquid adhering to an upper wall portion of the cup 7 and an upper surface of the spin base 9.

After a lapse of a predetermined period (e.g., 40 seconds) from the start of the supply of the DIW from the DIW nozzle 6, the controller 20 closes the DIW valve 18 to stop the supply of the DIW to the wafer W (Step S4 in FIG. 3: DIW supply stopping step).

Thereafter, the controller 20 controls the spin motor 8 to increase the rotation speed of the wafer W up to a predetermined higher rotation speed (e.g., 3000 rpm). Thus, the DIW is spun away from the wafer W (Step S5 in FIG. 3: spin drying step).

After the higher speed rotation of the wafer W is continued for a predetermined period, the controller 20 stops the rotation of the wafer W. Thus, the etching treatment for the single wafer W is completed, and the treated wafer W is unloaded from the treatment chamber 3 by the transport robot.

In Exemplary Process 1, as described above, the rotation speed of the wafer W is reduced to the lower rotation speed (e.g., 10 rpm) at the beginning of the DIW supplying step following the higher temperature etching liquid supplying step. Therefore, virtually no centrifugal force is generated by the rotation of the wafer W and acts on the DIW supplied onto the front surface of the wafer W. Accordingly, the DIW supplied onto the center portion of the front surface of the wafer W remains on the center portion. Thus, the DIW is supplied selectively onto the center portion of the front surface of the wafer W at the initial stage of the DIW supplying step. By thus supplying the DIW, the etching liquid is replaced with the DIW rapidly on the center portion of the front surface of the wafer W, but replaced with the DIW at a lower replacement efficiency on the peripheral edge portion of the front surface of the wafer W. Therefore, the etching liquid remains on the peripheral edge portion of the front surface of the wafer W. The peripheral edge portion of the wafer W is selectively etched with the remaining etching liquid. That is, the selective supply of the DIW onto the center portion of the front surface of the wafer W makes up for a delay in the etching of the peripheral edge portion of the front surface of the wafer W. Thus, the etching treatment can be evenly performed on the entire front surface of the wafer W.

Since the peripheral edge portion of the wafer W is selectively etched in the DIW supplying step, there is no need to additionally perform the step of selectively etching the peripheral edge portion of the wafer W. That is, the etching treatment can be evenly performed on the front surface of the wafer W without prolonging the overall process time.

Figure 3B:
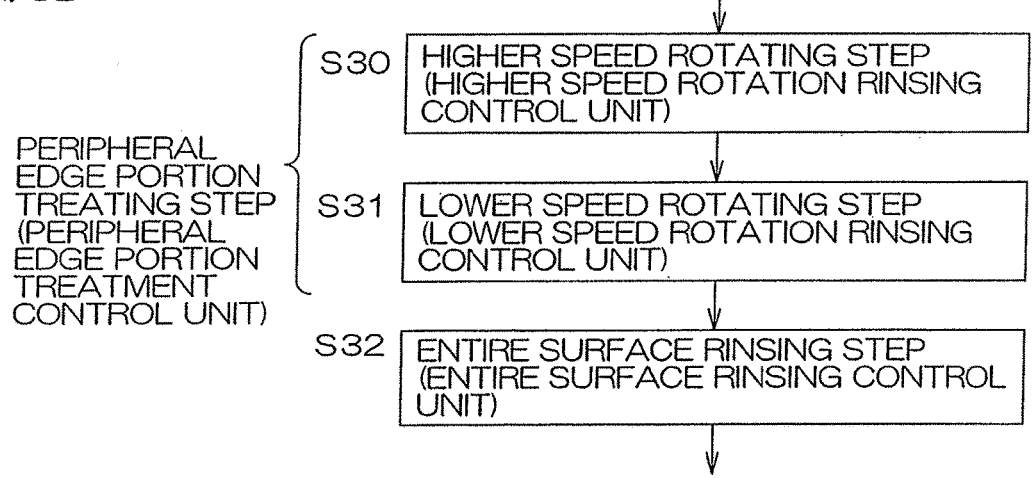
Figure 6:
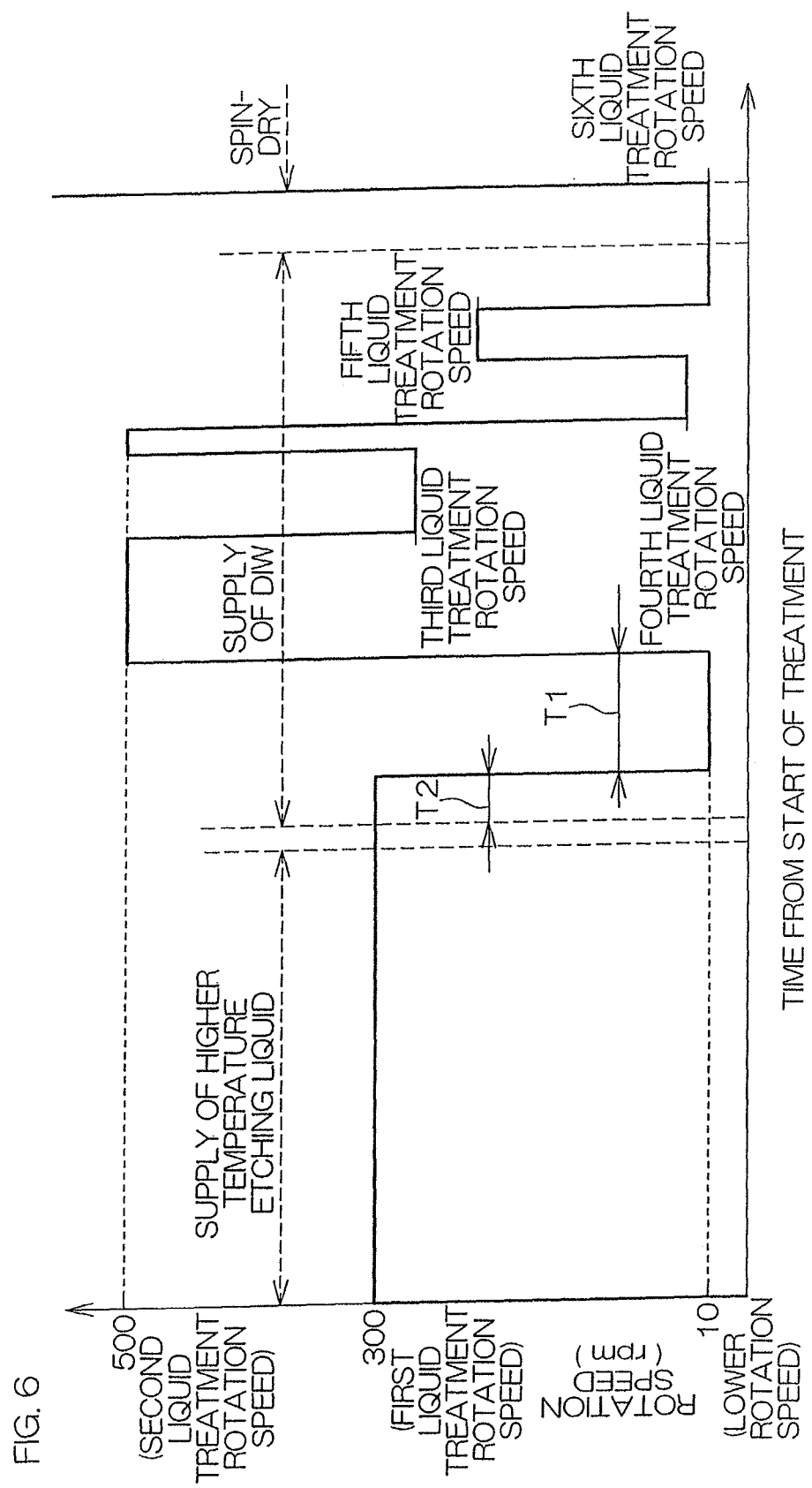
FIG. 6 is a diagram showing changes in wafer rotation speed in Exemplary Process 2.
Figure 7:
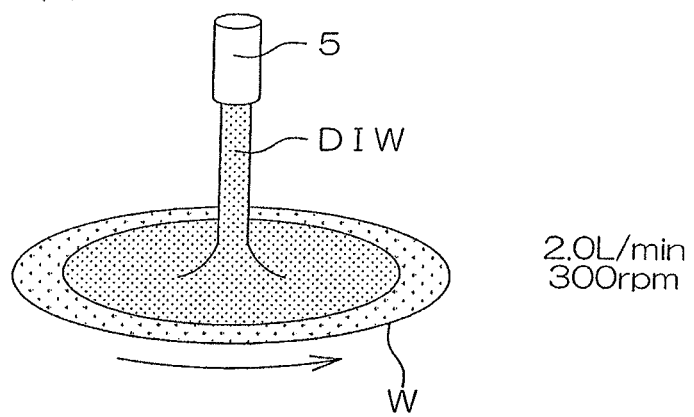
FIG. 7 is a diagram for explaining a wafer treatment state in a step (DIW supplying step) of Exemplary Process 2.

FIG. 6 is a diagram showing changes in the rotation speed of the wafer W in Exemplary Process 2. FIG. 7 is a diagram for explaining a wafer treatment state at an initial stage of a DIW supplying step of Exemplary Process 2. Further, FIG. 3B is a flow chart for explaining the DIW supplying step (Step S3 in FIG. 3) of Exemplary Process 2 in detail. Exemplary Process 2 will be described with reference to FIGS. 3, 6 and 7.

In Exemplary Process 2, the higher temperature etching liquid supplying step (Step S1 shown in FIG. 3), the higher temperature etching liquid supply stopping step (Step S2 shown in FIG. 3), the DIW supplying step (Step S3 shown in FIG. 3), the DIW supply stopping step (Step S4 shown in FIG. 3) and the spin drying step (Step S5 shown in FIG. 3) are performed in this order as in Exemplary Process 1. Exemplary Process 2 differs from Exemplary Process 1 in that, in the DIW supplying step, the timing at which the rotation speed of the wafer W is reduced to the lower rotation speed (e.g., 10 rpm) is delayed by a predetermined delay period T2 (e.g., 0.5 to 1.0 second) from the start of the DIW supplying step. Except for this feature, Exemplary Process 2 has substantially the same arrangement as Exemplary Process 1 and, therefore, duplicate description will be omitted.

More specifically, the controller 20 continuously rotates the wafer W at the first liquid treatment rotation speed to perform a higher speed rotating step (Step S30 in FIG. 3B) during the delay period T2 after the start of the supply of the ordinary temperature DIW (e.g., at 25° C.) from the DIW nozzle 6. Therefore, the DIW supplied onto the center portion of the front surface of the wafer W during the delay period T2 receives a centrifugal force generated by the rotation of the wafer W to spread over the front surface of the wafer W. During the delay period T2, the controller 20 functions as a higher speed rotation rinsing control unit.

After a lapse of the delay period T2, the controller 20 controls the spin motor 8 to reduce the rotation speed of the wafer W to a lower rotation speed (e.g., 10 rpm) (Step S31 in FIG. 3B: lower speed rotating step, lower speed rotation rinsing control unit). Due to the reduction in the rotation speed, virtually no centrifugal force acts on the DIW on the front surface of the wafer W. Thus, a DIW film covering the front surface of the wafer W no longer spreads, so that a relatively large DIW puddle is formed on the center portion of the front surface of the wafer W. The delay period T2 is determined so as to be necessary and sufficient for covering the entire center portion of the front surface of the wafer W with the DIW supplied from the DIW nozzle 6. Thus, the DIW hardly reaches the peripheral edge portion of the front surface of the wafer W, but the etching liquid remains only on the peripheral edge portion (see FIG. 7). Thus, only the peripheral edge portion of the wafer W can be selectively etched with the remaining etching liquid. Thereafter, the controller 20 controls the spin motor 8 to increase the rotation speed of the wafer W to the second liquid treatment rotation speed (e.g., 500 rpm), and performs an entire surface rinsing step (Step S32). For this function, the controller 20 serves as an entire surface rinsing control unit.

Figure 8:
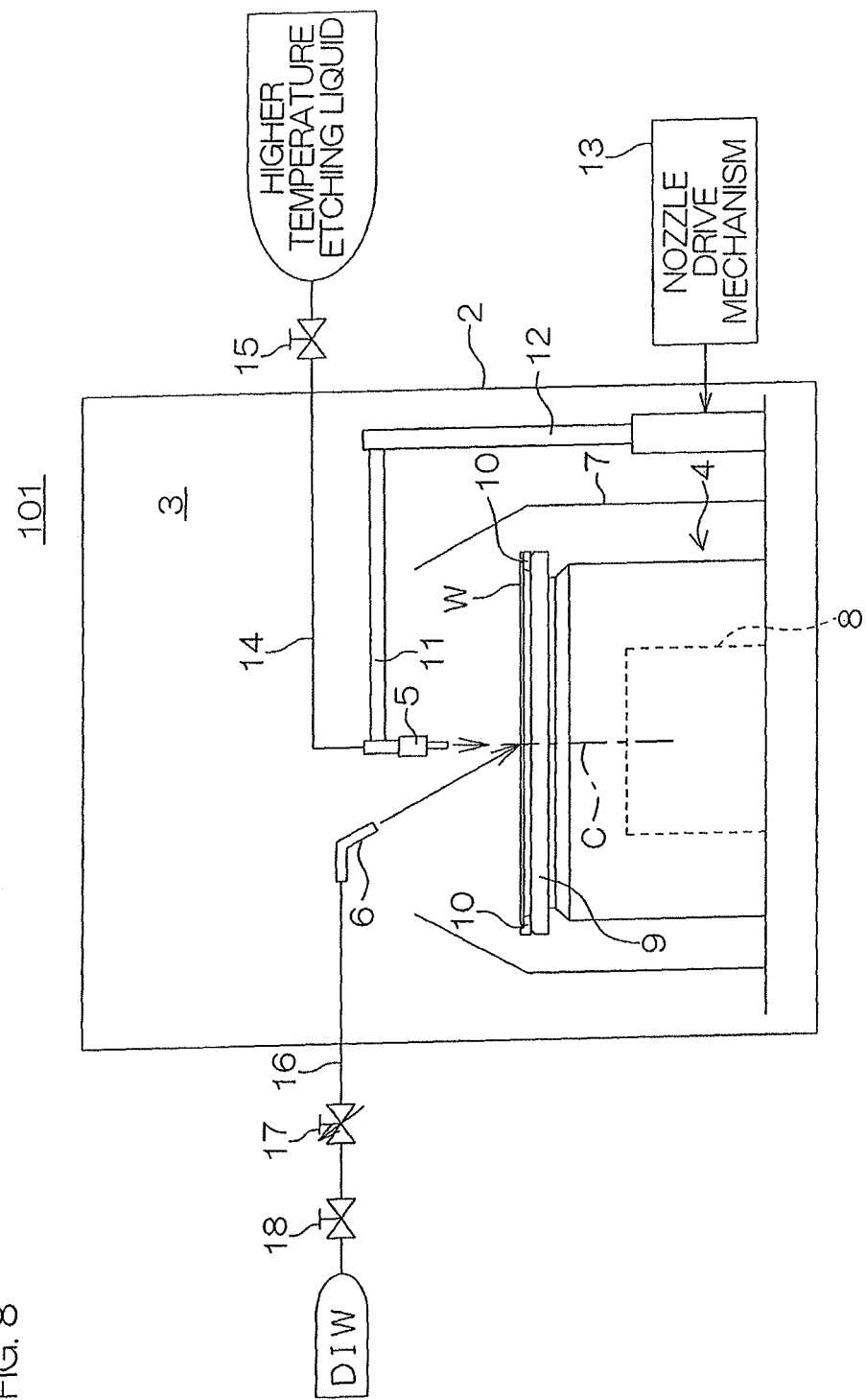
FIG. 8 is a schematic sectional view showing the construction of a substrate treatment apparatus according to a second embodiment of the present invention.

FIG. 8 is a schematic sectional view showing the construction of a substrate treatment apparatus 101 according to a second embodiment of the present invention. In FIG. 8, components corresponding to those shown in FIG. 1 will be designated by the same reference characters as in FIG. 1. The substrate treatment apparatus 101 shown in FIG. 8 differs from the substrate treatment apparatus 1 shown in FIG. 1 in that a flow rate adjusting valve 17 is provided in the DIW supply pipe 16 for adjusting the flow rate of the DIW flowing through the DIW supply pipe 16. The flow rate adjusting valve 17 is disposed between the DIW valve 18 and the DIW nozzle 6. The flow rate adjusting valve 17 is connected as a controllable component to the controller 20 (see FIG. 2)

Figure 3C:
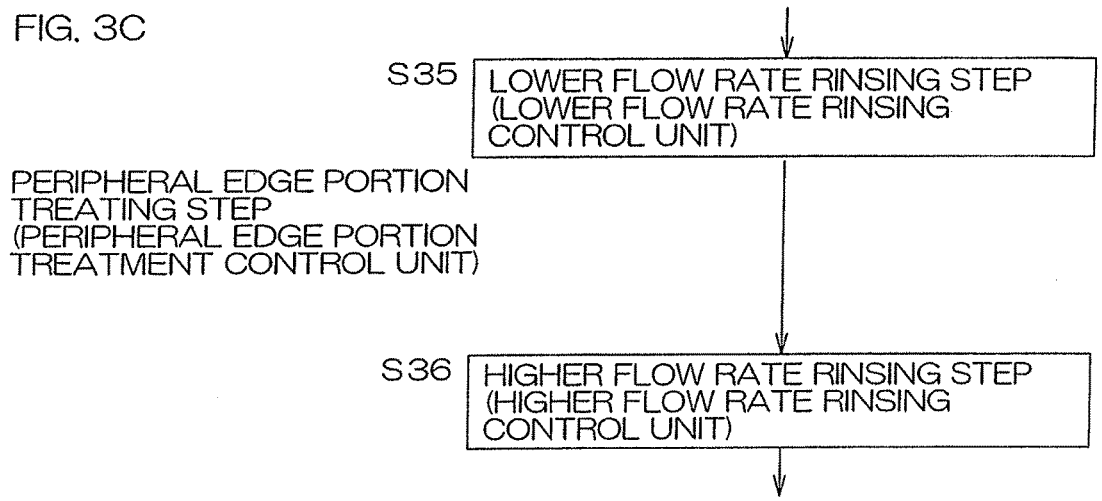
Figure 10A:
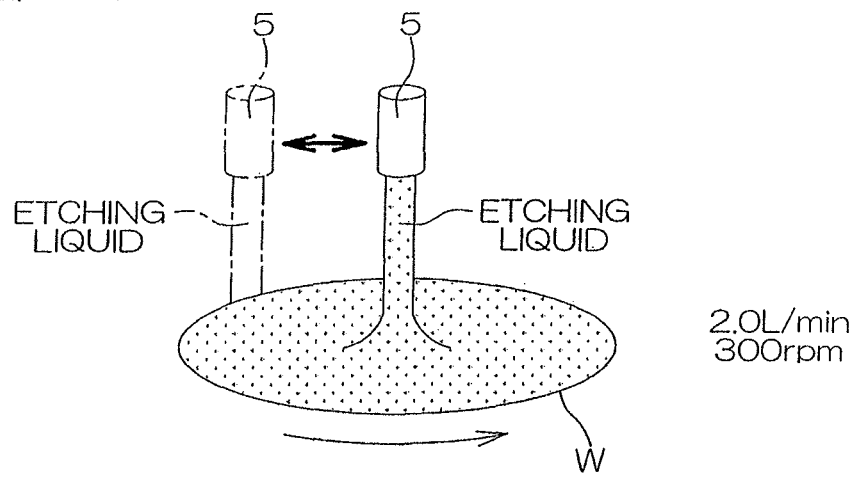
FIGS. 10A, 10B and 10C are diagrams for explaining wafer treatment states in various steps of Exemplary Process 3.
Figure 10B:
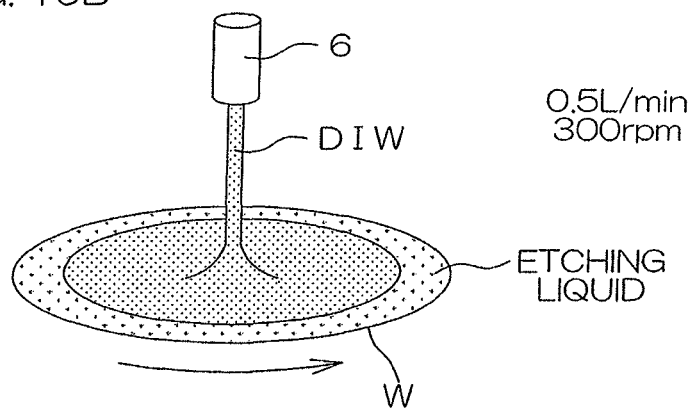
Figure 10C:
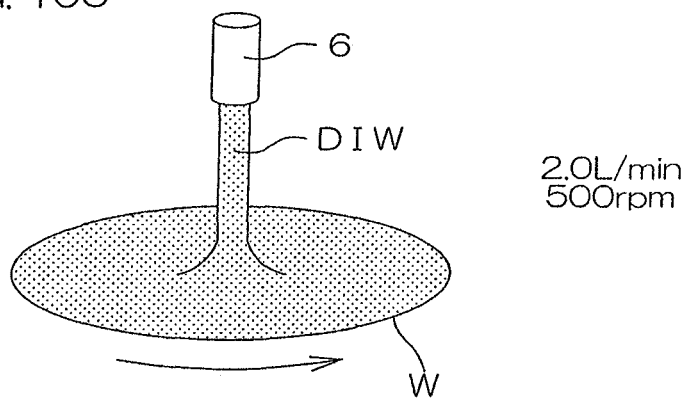

FIG. 9 is a diagram showing changes in the supply flow rates of treatment liquids (the etching liquid and the DIW) in Exemplary Process 3 in which an etching treatment is performed by the substrate treatment apparatus 101. FIGS. 10A, 10B and 10C are diagrams for explaining wafer treatment states in various steps of Exemplary Process 3. Further, FIG. 3C is a flow chart for explaining a DIW supplying step of Exemplary Process 3 (Step S3 in FIG. 3) in detail.

In Exemplary Process 3, a DIW supply flow rate at which the DIW is supplied at the initial stage of the DIW supplying step (Step S3 in FIG. 3) for selectively supplying the DIW onto the center portion of the front surface of the wafer W is lower than an etching liquid supply flow rate at which the etching liquid is supplied in the higher temperature etching liquid supplying step.

In Exemplary Process 3, the higher temperature etching liquid supplying step (Step S1 shown in FIG. 3), the higher temperature etching liquid supply stopping step (Step S2 shown in FIG. 3), the DIW supplying step (Step S3 shown in FIG. 3), the DIW supply stopping step (Step S4 shown in FIG. 3) and the spin drying step (Step S5 shown in FIG. 3) are performed in this order as in Exemplary Process 1. The rotation speed of the wafer W is changed in the same manner as in Exemplary Process 1 (see FIG. 4). However, as indicated by a broken line A, the lower speed rotation period T1 may be omitted and, even after the higher temperature etching liquid supply period, the rotation speed of the wafer W may be maintained at a liquid treatment rotation speed (300 rpm).

Exemplary Process 3 will be described with reference to FIGS. 3, 3C, 4 and FIGS. 8 to 10C.

A wafer W to be treated is loaded into the treatment chamber 3 and transferred to the spin chuck 4 with its front surface up by a transport robot (not shown). At this time, the chemical liquid nozzle 5 is located at the home position on a lateral side of the cup 7 so as not to hinder the loading of the wafer W.

After the wafer W is held by the spin chuck 4, the controller 20 controls the spin motor 8 to rotate the wafer W at a predetermined liquid treatment rotation speed (e.g., 300 rpm). The controller 20 swivels the arm 11 to move the chemical liquid nozzle 5 from the home position to the position on the rotation axis C of the wafer W.

Upon completion of the movement of the chemical liquid nozzle 5, the controller 20 opens the etching liquid valve 15 to supply the higher temperature etching liquid (e.g., at 60° C.) from the chemical liquid nozzle 5 (Step S1 in FIG. 3:

higher temperature etching liquid supplying step). In the higher temperature etching liquid supplying step, the etching liquid is supplied from the chemical liquid nozzle 5 at a constant flow rate of, for example, 2.0 L/min (see FIG. 9). In the higher temperature etching liquid supplying step, the controller 20 controls the nozzle drive mechanism 13 to pivot the arm 11 within a predetermined angular range. The arm 11 is pivoted at a constant speed. By the pivoting of the arm 11, the chemical liquid nozzle 5 is reciprocally moved between a position on the rotation axis C of the wafer W and a position above a peripheral edge portion of the wafer W. Thus, an etching liquid supply position (liquid application position) on the front surface of the wafer W is reciprocally moved along an arc crossing the direction of the rotation of the wafer W within a range from the rotation center of the wafer W to the peripheral edge portion of the wafer W (see FIG. 10A). In the higher temperature etching liquid supplying step, the wafer W is rotated at a constant rotation speed of, for example, 300 rpm (see FIGS. 4, 6 and 10A). The treatment with the etching liquid is performed in the same manner as in Exemplary Process 1 (FIG. 4) and Exemplary Process 2 (FIG. 6) in the first embodiment described above.

After a lapse of a predetermined period (e.g., 35 seconds) from the start of the supply of the etching liquid from the chemical liquid nozzle 5, the controller 20 closes the etching liquid valve 15 to stop the supply of the etching liquid to the wafer W (Step S2 shown in FIG. 3: higher temperature etching liquid supply stopping step, also see FIG. 9). The controller 20 swivels the arm 11 to return the chemical liquid nozzle 5 to the home position. In the higher temperature etching liquid supplying step of Step S1, as described above, the etching treatment proceeds at a relatively high rate on the center portion of the front surface of the wafer W, and proceeds at a relatively low rate on the other portion of the front surface of the wafer W. Therefore, the etching treatment is liable to unevenly proceed within the front surface of the wafer W.

After the supply of the etching liquid is stopped, the controller 20 opens the DIW valve 18 to supply ordinary temperature DIW (e.g., at 25° C.) from the DIW nozzle 6. The DIW is supplied from the DIW nozzle 6 onto the center portion of the front surface of the rotated wafer W (Step S3: DIW supplying step). At this time, the controller 20 controls the flow rate adjusting valve 17 to adjust the opening degree of the flow rate adjusting valve 17 so that the DIW is supplied from the DIW nozzle 6 at a predetermined lower flow rate (e.g., 0.5 L/min) that is lower than the flow rate of the etching liquid supplied in the etching liquid supplying step, and performs a lower flow rate rinsing step (Step S35 in FIG. 3C). For the lower flow rate rinsing step, the controller 20 functions as a lower flow rate rinsing control unit.

Since the DIW is supplied at the lower flow rate from the DIW nozzle 6 onto the front surface of the wafer W, the supplied DIW remains on the center portion of the front surface of the wafer W. In the presence of the DIW on the center portion of the wafer W, the etching liquid is replaced with the DIW rapidly on the center portion of the front surface of the wafer W, but replaced with the DIW at a lower replacement efficiency on the peripheral edge portion of the front surface of the wafer W. Therefore, the etching liquid remains on the peripheral edge portion of the front surface of the wafer W (see FIG. 10B). The peripheral edge portion of the front surface of the wafer W is selectively etched with the remaining etching liquid.

After a lapse of a predetermined lower flow rate period T3 (e.g., 1 to 10 seconds) from the start of the supply of the DIW from the DIW nozzle 6, the controller 20 controls the opening degree of the flow rate adjusting valve 17 to adjust the supply flow rate of the DIW from the DIW nozzle 6 at a predetermined higher flow rate (e.g., 2.0 L/min), and performs a higher flow rate rinsing step (Step S36 in FIG. 3C) (see FIG. 9). For the higher flow rate rinsing step, the controller 20 functions as a higher flow rate rinsing control unit.

The DIW supplied at the higher flow rate onto the front surface of the wafer W receives a centrifugal force generated by the rotation of the wafer W to flow toward the peripheral edge on the front surface of the wafer W to spread over the entire front surface of the wafer W (see FIG. 10C, entire surface rinsing step). Thus, the etching liquid is rinsed away from the front surface of the wafer W with the DIW.

In Exemplary Process 3, as shown by the broken line A in FIG. 4, the rotation speed of the wafer W may be maintained at the liquid treatment rotation speed (300 rpm). However, the rotation speed of the wafer W is changed in the same manner as in Exemplary Process 1 (see FIG. 4) after a predetermined timing (e.g., after a lapse of 25 seconds from the start of the supply of the DIW). A DIW scattering direction in which the DIW is scattered from the peripheral edge of the wafer W is changed by changing the rotation speed of the wafer W to rinse away the etching liquid and the like adhering to the upper wall portion of the cup 7 and the upper surface of the spin base 9.

After a lapse of a predetermined period (e.g., 40 seconds) from the start of the supply of the DIW from the DIW nozzle 6, the controller 20 closes the DIW valve 18 to stop the supply of the DIW to the wafer W (Step S4: DIW supply stopping step).

Thereafter, the controller 20 controls the spin motor 8 to increase the rotation speed of the wafer W up to a predetermined higher rotation speed (e.g., 3000 rpm). Thus, the DIW is spun away from the wafer W (Step S5: spin drying step).

After the higher speed rotation of the wafer W is continued for a predetermined period, the controller 20 stops the rotation of the wafer W. Thus, the etching treatment for the single wafer W is completed, and the treated wafer W is unloaded from the treatment chamber 3 by the transport robot.

In the second embodiment (Exemplary Process 3), as described above, the DIW supply flow rate at the initial stage of the DIW supplying step is lower than the etching liquid supply flow rate in the higher temperature etching liquid supplying step. Therefore, the DIW supplied onto the front surface of the wafer W at the initial stage of the DIW supplying step hardly spreads, but remains on the center portion of the front surface of the wafer W.

Thus, the DIW is selectively supplied onto the center portion of the front surface of the wafer W at the initial stage of the DIW supplying step. By the selective supply of the DIW, the etching liquid is replaced with the DIW rapidly on the center portion of the front surface of the wafer W, but replaced with the DIW at a lower replacement efficiency on the peripheral edge portion of the front surface of the wafer W. Therefore, the etching liquid remains on the peripheral edge portion of the front surface of the wafer W. The peripheral edge portion of the wafer W is selectively etched with the remaining etching liquid. This makes up for a delay in the etching treatment on the peripheral edge portion of the front surface of the wafer W. Thus, the etching treatment can be evenly performed on the entire front surface of the wafer W.

Since the peripheral edge portion of the wafer W is selectively etched with the remaining etching liquid in the DIW supplying step, there is no need to additionally perform the step of selectively etching the peripheral edge portion of the wafer W. That is, the etching treatment can be evenly performed on the front surface of the wafer W without prolonging the overall process time.

Exemplary Process 3 may be combined with Exemplary Process 1 (FIG. 4) or Exemplary Process 2 (FIG. 6). Where Exemplary Process 1 and Exemplary Process 3 are combined together, the wafer W is rotated at the lower rotation speed during the lower speed rotation period T1, and the DIW is supplied at the lower flow rate during the lower flow rate period T3 at the initial stage of the DIW supplying step. Where Exemplary Process 2 and Exemplary Process 3 are combined together, the lower speed rotation period T1 is started with a delay of the delay period T2 from the start of the supply of the DIW, and the DIW is supplied at the lower flow rate during the lower flow rate period T3.

Figure 11:
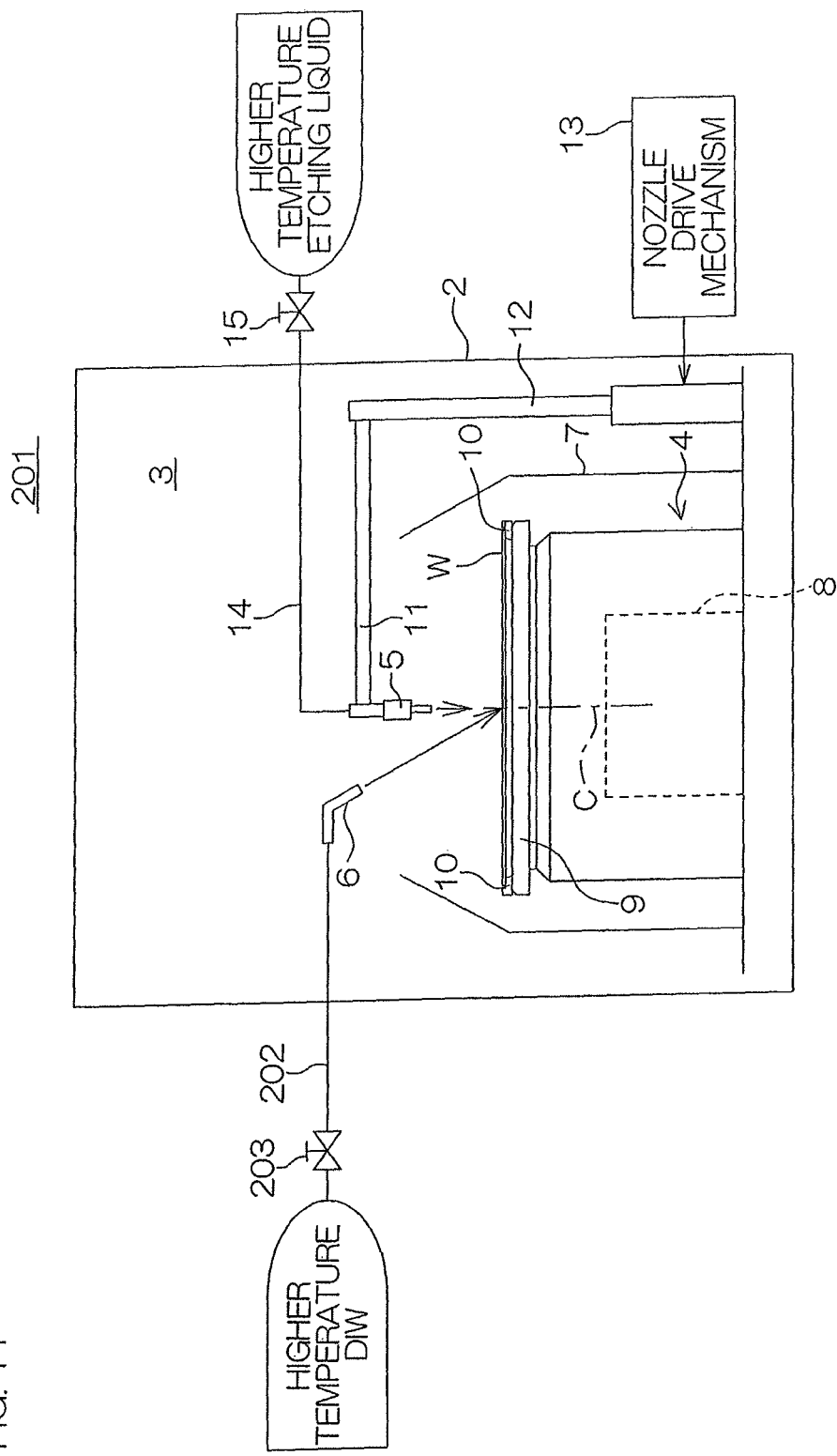
FIG. 11 is a schematic sectional view showing the construction of a substrate treatment apparatus according to a third embodiment of the present invention.

FIG. 11 is a schematic sectional view showing the construction of a substrate treatment apparatus 201 according to a third embodiment of the present invention. In this embodiment, the DIW nozzle 6 is connected to a higher temperature DIW supply pipe 202 to which DIW (higher temperature DIW) heated up to about 60° C. is supplied from a higher temperature DIW supply source. A higher temperature DIW valve 203 for switching on and off the supply of the higher temperature DIW from the DIW nozzle 6 is provided in the higher temperature DIW supply pipe 202. The higher temperature DIW valve 203 is connected as a controllable component to the controller 20 (see FIG. 2).

Figure 12:
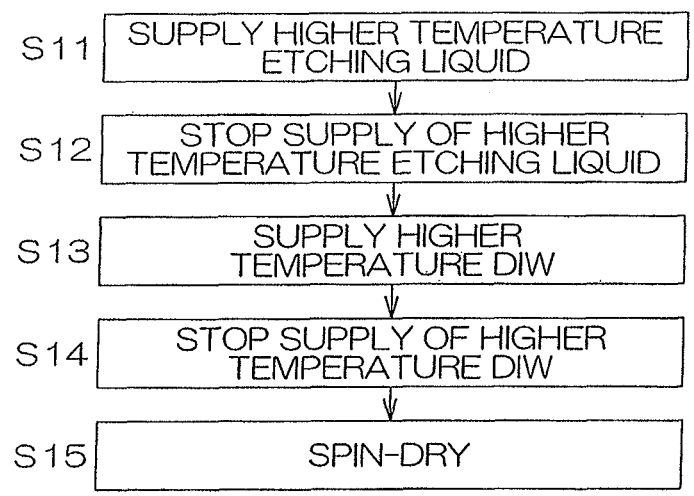
FIG. 12 is a process diagram for Exemplary Process 4.

FIG. 12 is a process diagram for Exemplary Process 4 in which an etching treatment is performed by the substrate treatment apparatus 201.

In Exemplary Process 4, higher temperature DIW (at 60° C.) is used instead of the ordinary temperature DIW as a rinse liquid for the rinsing.

A higher temperature etching liquid supplying step (Step S11), a higher temperature etching liquid supply stopping step (Step S12), a higher temperature DIW supplying step (Step S13), a higher temperature DIW supply stopping step (Step S14) and a spin drying step (Step S15) shown in FIG. 12 are performed in substantially the same manner as the higher temperature etching liquid supplying step (Step S1 shown in FIG. 3), the higher temperature etching liquid supply stopping step (Step S2 shown in FIG. 3), the DIW supplying step (Step S3 shown in FIG. 3), the DIW supply stopping step (Step S4 shown in FIG. 3) and the spin drying step (Step S5 shown in FIG. 3) performed in Exemplary Processes 1, 2, 3.

In Exemplary Processes 1, 2, 3 of the first embodiment described above, the ordinary temperature DIW is supplied as the rinse liquid to the front surface of the wafer W. Therefore, the etching liquid present on the front surface of the wafer W is deprived of heat by the DIW supplied onto the front surface of the wafer W at the beginning of the DIW supplying step (Step S3 in FIG. 3), so that the liquid temperature is abruptly reduced. In this case, the temperature of the etching liquid remaining on the peripheral edge portion of the wafer W is reduced, thereby reducing the etching ability of the etching liquid.

In the third embodiment (Exemplary Process 4), on the other hand, the higher temperature DIW is supplied onto the front surface of the wafer W. This suppresses the reduction in the temperature of the etching liquid remaining on the peripheral edge portion. Thus, the etching liquid remaining on the peripheral edge portion has a higher etching ability.

The third embodiment (Exemplary Process 4) may be combined with Exemplary Process 1, Exemplary Process 2 or Exemplary Process 3. That is, the higher temperature DIW may be used instead of the ordinary temperature DIW in Exemplary Processes 1, 2 and 3. It is particularly preferred to combine Exemplary Process 4 with Exemplary Process 2 (see FIG. 6). At the beginning of the DIW supplying step, a smaller amount of the etching liquid remains on the front surface of the wafer W in Exemplary Process 2 than in Exemplary Process 1. With the use of the higher temperature DIW, the etching liquid remaining on the front surface of the wafer W is maintained at a higher temperature and, therefore, has a higher etching ability. Thus, the etching treatment can be advantageously performed on the wafer W.

Of course, Exemplary Processes 1, 3 and 4 may be combined together. In this case, the wafer W is rotated at the lower rotation speed during the lower speed rotation period T1, and the higher temperature DIW is supplied at the lower flow rate during the lower flow rate period T3 at the initial stage of the higher temperature DIW supplying step. Further, Exemplary Processes 2, 3 and 4 may be combined together. In this case, the lower speed rotation period T1 is started with a delay of the delay period T2 from the start of the supply of the higher temperature DIW, and the higher temperature DIW is supplied at the lower flow rate during the lower flow rate period T3 at the initial stage of the higher temperature DIW supplying step.

Next, a first etching test will be described.

In the first etching test, the following etching treatment was performed by means of the substrate treatment apparatus 1 by employing a sample of a silicon wafer W (having an outer diameter of 300 mm) having an oxide film formed on a front surface thereof.

EXAMPLE 1

The etching treatment was performed on the sample according to Exemplary Process 1 (see FIGS. 3A and 4). The lower rotation speed was 10 rpm, and the lower speed rotation period T1 was 10 seconds.

EXAMPLE 2

The etching treatment was performed on the sample according to Exemplary Process 2 (see FIGS. 3B and 6). The lower rotation speed was 10 rpm, and the lower speed rotation period T1 was 10 seconds. Further, the delay period T2 was 0.7 second.

Comparative Example 1

The etching treatment was performed in the same manner as in Exemplary Process 1, in which the rotation speed of the wafer W was maintained at the first liquid treatment rotation speed (as indicated by the broken line A in FIG. 4) even after the supply of the etching liquid was stopped. After a lapse of 10 seconds from the start of the supply of the DIW, the rotation speed of the wafer W was changed in the same manner as in Exemplary Process 1 (see FIG. 4).

In Examples 1 and 2 and Comparative Example 1, the first liquid treatment rotation speed (the rotation speed of the wafer W in the etching liquid supplying step) was 300 rpm, and the second liquid treatment rotation speed (the rotation speed of the wafer W in the DIW supplying step) was 300 rpm.

The flow rate and the temperature of the etching liquid supplied from the chemical liquid nozzle 5 were 2.0 L/min and 60° C., respectively. A diluted hydrofluoric acid solution was used as the etching liquid. The DIW supplied from the DIW nozzle 6 had a constant flow rate of 2.0 L/min and a liquid temperature of 25° C.

Figure 13:
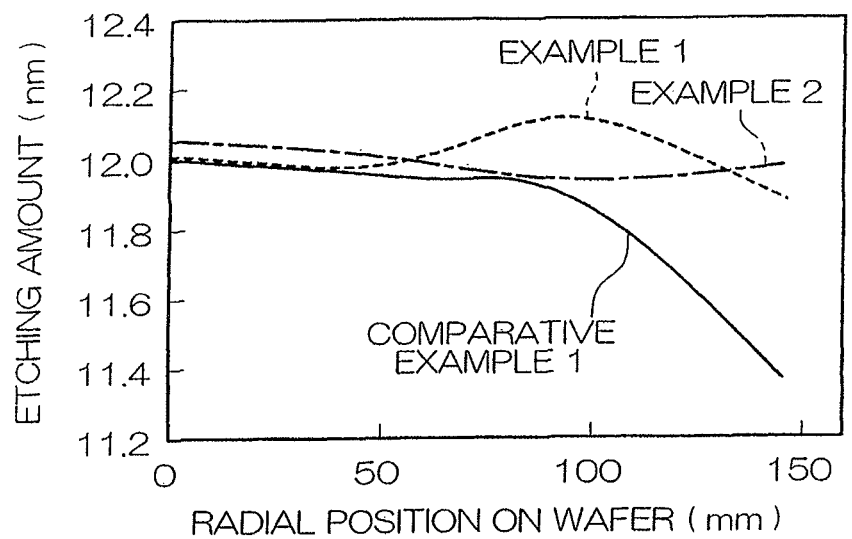
FIG. 13 is a graph showing in-plane etching amount distributions determined in a first etching test.

The in-plane distribution of the etching amount of the oxide film on the wafer W (a relationship between the radial position on the wafer W and the etching amount) in each of Examples 1 and 2 and Comparative Example 1 was determined. The results of the etching test are shown in FIG. 13. FIG. 13 is a graph showing the in-plane etching amount distributions determined in the first etching test. In FIG. 13, the radial position on the wafer W (a distance from the center of the wafer W) is plotted as abscissa, and the etching amount is plotted as ordinate.

Next, a second etching test will be described.

In the second etching test, the following etching treatment was performed by means of the substrate treatment apparatuses 1, 101, 201 by using a sample of a silicon wafer W (having an outer diameter of 300 mm) having an oxide film formed on a front surface thereof.

EXAMPLE 3

The etching treatment was performed on the sample in substantially the same manner as in Exemplary Process 1 (see FIGS. 3A and 4) with the use of the substrate treatment apparatus 1. The lower rotation speed was 10 rpm, and the lower speed rotation period T1 was 10 seconds. The temperature of the DIW spouted from the DIW nozzle 6 was 25° C. The treatment of Example 3 differs from the treatment of Exemplary Process 1 in that the movement of the chemical liquid nozzle 5 was stopped with the spout of the chemical liquid nozzle 5 directed toward the rotation center of the front surface of the wafer W in the etching liquid supplying step (so-called center spouting method).

EXAMPLE 4

The etching treatment was performed on the sample in substantially the same manner as in Exemplary Process 3 (see FIGS. 3C and 9) with the use of the substrate treatment apparatus 101 (see FIG. 8). The flow rate of the DIW supplied from the DIW nozzle 6 during the lower flow rate period T3 was 0.5 L/min. Further, the temperature of the DIW spouted from the DIW nozzle 6 was 25° C. The treatment of Example 4 differs from the treatment of Exemplary Process 3 in that the movement of the chemical liquid nozzle 5 was stopped with the spout of the chemical liquid nozzle 5 directed toward the rotation center of the front surface of the wafer W in the etching liquid supplying step (so-called center spouting method).

EXAMPLE 5

The etching treatment was performed on the sample according to the combination of Exemplary Process 1 (FIGS. 3A and 4), Exemplary Process 3 (FIGS. 3C and 9) and Exemplary Process 4 (FIG. 12) with the use of the substrate treatment apparatus 201 (see FIG. 11). That is, the rotation speed of the wafer W was the lower rotation speed during the lower speed rotation period T1, and the supply flow rate of the higher temperature DIW was the predetermined lower flow rate during the lower flow rate period T3 at the initial stage of the higher temperature DIW supplying step. More specifically, the lower rotation speed was 10 rpm, and the lower speed rotation period T1 and the lower flow rate period T3 were each 10 seconds. The flow rate of the DIW supplied from the DIW nozzle 6 was 0.5 L/min during the lower flow rate period T3. The temperature of the DIW spouted from the DIW nozzle 6 was 60° C. In Example 5, the movement of the chemical liquid nozzle 5 was stopped with the spout of the chemical liquid nozzle 5 directed toward the rotation center of the front surface of the wafer W in the etching liquid supplying step (so-called center spouting method).

Comparative Example 2

The etching treatment was performed in the same manner as in Exemplary Process 1, in which the rotation speed of the wafer W was maintained at the first liquid treatment rotation speed even after the supply of the etching liquid was stopped (as indicated by the broken line A in FIG. 4). After a lapse of 10 seconds from the start of the supply of the DIW, the rotation speed of the wafer W was changed in the same manner as in Exemplary Process 1 (see FIG. 4).

Unlike in Exemplary Process 1, the movement of the chemical liquid nozzle 5 was stopped with the spout of the chemical liquid nozzle 5 directed toward the rotation center of the front surface of the wafer W in the etching liquid supplying step (so-called center spouting method). Further, the temperature of the DIW spouted from the DIW nozzle 6 was 25° C.

In Examples 3, 4 and 5 and Comparative Example 2, the first liquid treatment rotation speed (the rotation speed of the wafer W in the etching liquid supplying step) was 1000 rpm, and the second liquid treatment rotation speed (the rotation speed of the wafer W in the DIW supplying step and the higher temperature DIW supplying step) was 1000 rpm.

The flow rate and the temperature of the etching liquid supplied from the chemical liquid nozzle 5 were 2.0 L/min and 60° C., respectively. A diluted hydrofluoric acid solution was used as the etching liquid. The flow rate of the DIW supplied from the DIW nozzle 6 was 2.0 L/min during a period except for the lower flow rate period T3.

Figure 14:
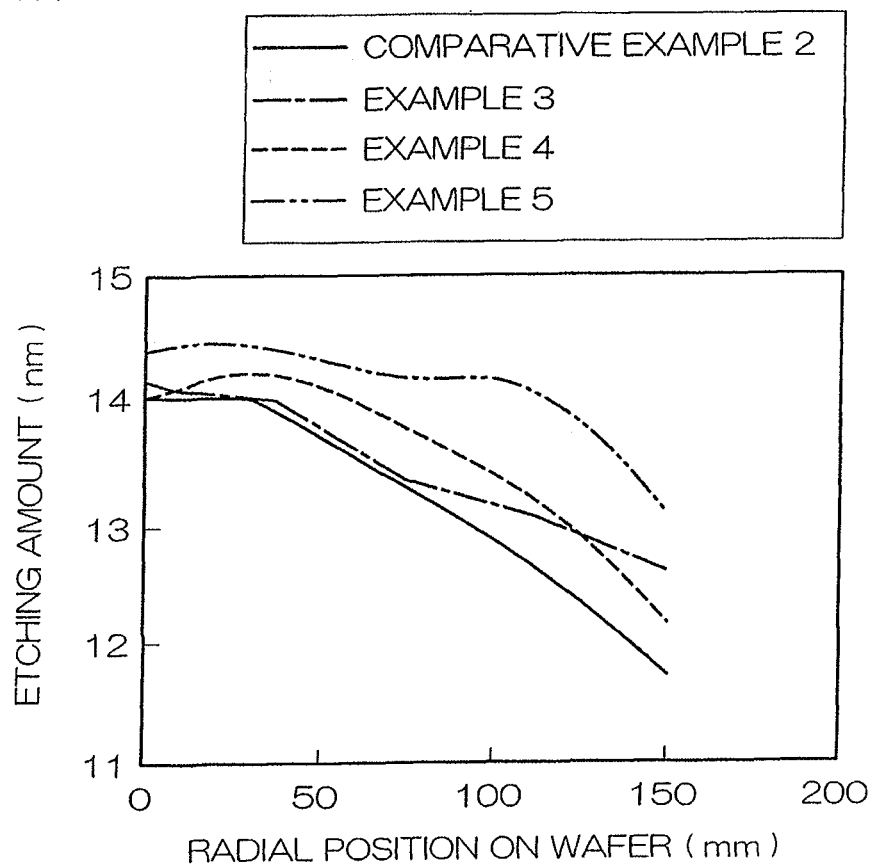
FIG. 14 is a graph showing in-plane etching amount distributions determined in a second etching test.

The in-plane distribution of the etching amount of the oxide film of the wafer W (a relationship between the radial position on the wafer W and the etching amount) in each of Examples 3, 4 and 5 and Comparative Example 2 was determined. The results of the etching test are shown in FIG. 14. FIG. 14 is a graph showing the in-plane etching amount distributions determined in the second etching test. In FIG. 14, the radial position on the wafer W (a distance from the center of the wafer W) is plotted as abscissa, and the etching amount is plotted as ordinate.

As can be understood from FIGS. 13 and 14, it was possible to suppress the reduction in the etching amount on the peripheral edge portion of the wafer W in Examples 1 to 5. Particularly, Example 2 was excellent in in-plane etching evenness.

While the three embodiments of the present invention have thus been described, the invention may be embodied in other ways.

In Exemplary Process 1 of the first embodiment, the reduction in the rotation speed of the wafer W may be started at the beginning of the DIW supplying step (Step S3) rather than at the end of the higher temperature etching liquid supplying step (Step S2).

In the DIW supplying step (Step S3 shown in FIG. 3) or the higher temperature DIW supplying step (Step S13 shown in FIG. 12), the supply of the DIW (higher temperature DIW) may be started immediately after the supply of the etching liquid is stopped.

The lower rotation speed of the wafer W (the rotation speed during the lower speed rotation period T1) is 10 rpm by way of example, but may be in the range of 0 rpm to 100 rpm, which does not generate a centrifugal force sufficient to move the DIW supplied onto the wafer W.

In Exemplary Process 3 of the second embodiment, the flow rate of the DIW supplied from the DIW nozzle 6 may be a lower flow rate (e.g., 0.5 L/min) throughout the period of the DIW supplying step (Step S3 shown in FIG. 3) or the higher temperature DIW supplying step (Step S13 shown in FIG. 12).

In the embodiments described above, the chemical liquid nozzle 5 may be scanned by a so-called one-way scanning method so that the chemical liquid is supplied from the chemical liquid nozzle 5 only when the chemical liquid nozzle 5 is moved in one of opposite directions in the etching liquid supplying step (Step S1 shown in FIG. 3 or Step S11 shown in FIG. 12). Further, the chemical liquid nozzle 5 may be scanned between a pair of peripheral edge positions located on opposite sides of the rotation center of the wafer W.

The embodiments described above are directed to the etching treatment for removal of the oxide film. Similarly, the present invention is applicable to an etching treatment for removal of a nitride film of the wafer W. In this case, phosphoric acid, for example, may be used as the etching liquid. Further, the present invention is applicable to an etching treatment for thinning the wafer W. In this case, a hydrofluoric acid/nitric acid mixture, for example, may be used as the etching liquid.

A cleaning treatment or other treatment with a chemical liquid may be performed on the wafer W. Examples of the chemical liquid include the hydrofluoric acid described above, SC1 (ammonia/hydrogen peroxide mixture), SC2 (hydrochloric acid/hydrogen peroxide mixture), SPM (sulfuric acid/hydrogen peroxide mixture), and buffered HF (hydrofluoric acid/ammonium fluoride mixture).

In the embodiments described above, the DIW is used as the rinse liquid by way of example. Other examples of the rinse liquid include carbonated water, electrolyzed ion water, ozone water, reduced water (hydrogen water) and magnetized water.

In the embodiments described above, the movement of the chemical liquid nozzle 5 may be stopped with the spout of the chemical liquid nozzle 5 directed toward the rotation center of the front surface of the wafer W during the supply of the higher temperature etching liquid (Step S1 shown in FIG. 3 or Step S11 shown in FIG. 12) as described in Examples (so-called center spouting method). In this case, the etching liquid is supplied onto the center portion of the front surface of the wafer W. The etching liquid supplied onto the front surface of the wafer W receives a centrifugal force generated by the rotation of the wafer W to flow toward the peripheral edge of the wafer W on the front surface of the wafer W and spread over the entire front surface of the wafer W. Thus, the entire front surface of the wafer W is treated with the etching liquid.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2010-217217 filed in the Japanese Patent Office on Sep. 28, 2010, the disclosure of which is incorporated herein by reference in its entirety.

What is claimed is:

1. A substrate treatment apparatus comprising:
   a treatment chamber;
   a spin chuck which rotates a substrate in the treatment chamber;
   a higher temperature etching liquid nozzle which supplies a higher temperature etching liquid onto a front surface of the substrate, the higher temperature etching liquid having a higher temperature than the treatment chamber;
   a rinse liquid nozzle which supplies a rinse liquid onto the front surface of the substrate to rinse away the etching liquid; and
   a controller which is configured and programmed to control a rotating operation of the spin chuck, an etching liquid supplying operation of the higher temperature etching liquid nozzle and a rinse liquid supplying operation of the rinse liquid nozzle;
   wherein the controller is configured and programmed to perform:
   a higher temperature etching liquid supply control to control the spin chuck and the higher temperature etching liquid nozzle so as to supply the higher temperature etching liquid onto the front surface of the substrate while rotating the substrate at a first liquid treatment rotation speed;
   a lower speed rotation rinsing control to control the spin chuck and the rinse liquid nozzle so as to rotate the substrate at a lower rotation speed while supplying the rinse liquid onto a center portion of the front surface of the substrate on which the etching liquid remains, the lower rotation speed being determined so that the rinse liquid remains on the center portion of the front surface of the substrate to form a liquid film of the rinse liquid covering the center portion while the etching liquid remains on a peripheral edge portion of the front surface of the substrate with the peripheral edge portion not being covered by the liquid film of the rinse liquid; and
   an entire surface rinsing control to control the spin chuck and the rinse liquid nozzle so as to spread the rinse liquid over the entire front surface of the substrate by rotating the substrate at a second liquid treatment rotation speed higher than the lower rotation speed while supplying the rinse liquid onto the center portion of the front surface of the substrate.

2. The substrate treatment apparatus according to claim 1, wherein the controller is configured and programmed to further perform:
   a lower flow rate rinsing control to control the spin chuck and the rinse liquid nozzle so as to supply the rinse liquid onto the center portion of the front surface of the substrate at a predetermined lower flow rate while rotating the substrate; and
   a higher flow rate rinsing control to control the spin chuck and the rinse liquid nozzle so as to supply the rinse liquid onto the center portion of the front surface of the substrate at a higher flow rate higher than the lower flow rate while rotating the substrate.

3. The substrate treatment apparatus according to claim 1, wherein the rinse liquid nozzle supplies a higher temperature rinse liquid onto the front surface of the substrate, the higher temperature rinse liquid having a higher temperature than the treatment chamber.

4. A substrate treatment apparatus comprising:
   a treatment chamber;
   a spin chuck which rotates a substrate in the treatment chamber;
   a higher temperature etching liquid nozzle which supplies a higher temperature etching liquid onto a front surface of the substrate, the higher temperature etching liquid having a higher temperature than the treatment chamber;
   a rinse liquid nozzle which supplies a rinse liquid onto the front surface of the substrate to rinse away the etching liquid; and
   a controller which is configured and programmed to control a rotating operation of the spin chuck, an etching liquid supplying operation of the higher temperature etching liquid nozzle and a rinse liquid supplying operation of the rinse liquid nozzle;
   wherein the controller is configured and programmed to perform:
   a higher temperature etching liquid supply control to control the spin chuck and the higher temperature etching liquid nozzle so as to supply the higher temperature etching liquid onto the front surface of the substrate while rotating the substrate at a first liquid treatment rotation speed;
   a higher speed rotation rinsing control to control the spin chuck and the rinse liquid nozzle so as to rotate the substrate at the first liquid treatment rotation speed for a predetermined period while supplying the rinse liquid onto a center portion of the front surface of the substrate on which the etching liquid remains, the period being predetermined so that the rinse liquid spreads on the center portion of the front surface of the substrate so as to form a liquid film of the rinse liquid covering the center portion while the etching liquid remains on a peripheral edge portion of the front surface of the substrate with the peripheral edge portion not being covered by the liquid film of the rinse liquid;
   a lower speed rotation rinsing control to control the spin chuck and the rinse liquid nozzle so as to rotate the substrate at a lower rotation speed while supplying the rinse liquid onto the center portion of the front surface of the substrate, the lower rotation speed being determined so that the rinse liquid remains on the center portion of the front surface of the substrate so as to maintain the liquid film of the rinse liquid covering the center portion while the etching liquid remains on the peripheral edge portion with the peripheral edge portion not being covered by the liquid film of the rinse liquid; and
   an entire surface rinsing control to control the spin chuck and the rinse liquid nozzle so as to spread the rinse liquid over the entire front surface of the substrate by rotating the substrate at a second liquid treatment rotation speed higher than the lower rotation speed while supplying the rinse liquid onto the center portion of the front surface of the substrate.

5. A substrate treatment apparatus comprising:
   a treatment chamber;
   a spin chuck which rotates a substrate in the treatment chamber;
   a higher temperature etching liquid nozzle which supplies a higher temperature etching liquid onto a front surface of the substrate, the higher temperature etching liquid having a higher temperature than the treatment chamber;
   a rinse liquid nozzle which supplies a rinse liquid onto the front surface of the substrate to rinse away the etching liquid; and
   a controller which is configured and programmed to control a rotating operation of the spin chuck, an etching liquid supplying operation of the higher temperature etching liquid nozzle and a rinse liquid supplying operation of the rinse liquid nozzle;
   wherein the controller is configured and programmed to perform:
   a higher temperature etching liquid supply control to control the spin chuck and the higher temperature etching liquid nozzle so as to supply the higher temperature etching liquid onto the front surface of the substrate at a first flow rate while rotating the substrate;
   a lower flow rate rinsing control to control the spin chuck and the rinse liquid nozzle so as to supply the rinse liquid onto a center portion of the front surface of the substrate, on which the etching liquid remains, at a second flow rate lower than the first flow rate while rotating the substrate so as to form a liquid film of the rinse liquid covering the center portion while the etching liquid remains on a peripheral edge portion of the front surface of the substrate with the peripheral edge portion not being covered by the liquid film of the rinse liquid; and
   a higher flow rate rinsing control to control the spin chuck and the rinse liquid nozzle so as to supply the rinse liquid onto the center portion of the front surface of the substrate at a third flow rate higher than the second flow rate while rotating the substrate, thereby spreading the rinse liquid over the entire front surface of the substrate.

\* \* \* \* \*